(12) United States Patent
Nagel et al.

(10) Patent No.: US 7,577,010 B2
(45) Date of Patent: Aug. 18, 2009

(54) INTEGRATED CIRCUITS, METHODS FOR MANUFACTURING INTEGRATED CIRCUITS, INTEGRATED MEMORY ARRAYS

(75) Inventors: Nicolas Nagel, Dresden (DE); Josef Willer, Riemerling (DE)

(73) Assignee: Qimonda AG, Munich (DE)

( * ) Notice: Subject to any disclaimer, the term of this patent is extended or adjusted under 35 U.S.C. 154(b) by 365 days.

(21) Appl. No.: 11/686,211

(22) Filed: Mar. 14, 2007

(65) Prior Publication Data
US 2008/0225587 A1    Sep. 18, 2008

(51) Int. Cl.
*G11C 5/06* (2006.01)
(52) U.S. Cl. ............................. 365/63; 365/51; 365/72; 365/182; 365/230.06
(58) Field of Classification Search ................... 365/63, 365/72, 51, 182, 189.02, 230.06
See application file for complete search history.

(56) References Cited

U.S. PATENT DOCUMENTS

| 6,515,511 B2 | 2/2003 | Sugibayashi et al. |
| 7,330,368 B2 * | 2/2008 | Saito et al. ..................... 365/63 |
| 2006/0139056 A1 | 6/2006 | Madurawe |
| 2006/0231823 A1* | 10/2006 | Moore et al. ................... 257/2 |

\* cited by examiner

*Primary Examiner*—Pho M Luu
*Assistant Examiner*—Toan Le
(74) *Attorney, Agent, or Firm*—Slater & Matsil, L.L.P.

(57) ABSTRACT

The present invention relates generally to integrated circuits, to methods for manufacturing integrated circuits, and to integrated memory arrays.

28 Claims, 19 Drawing Sheets

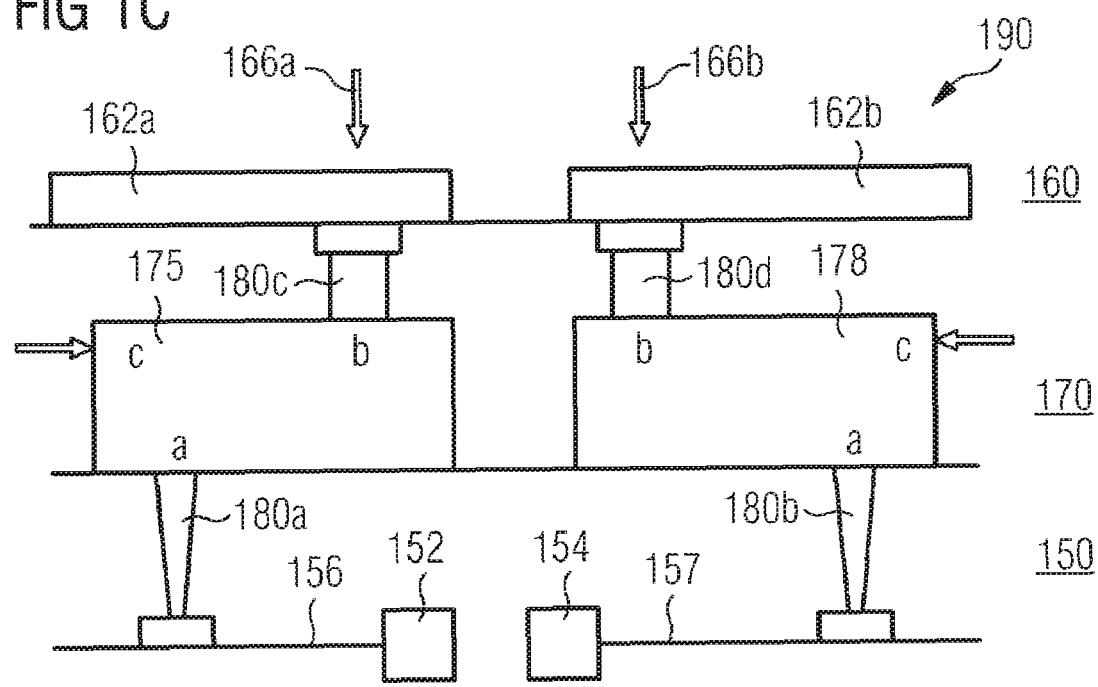
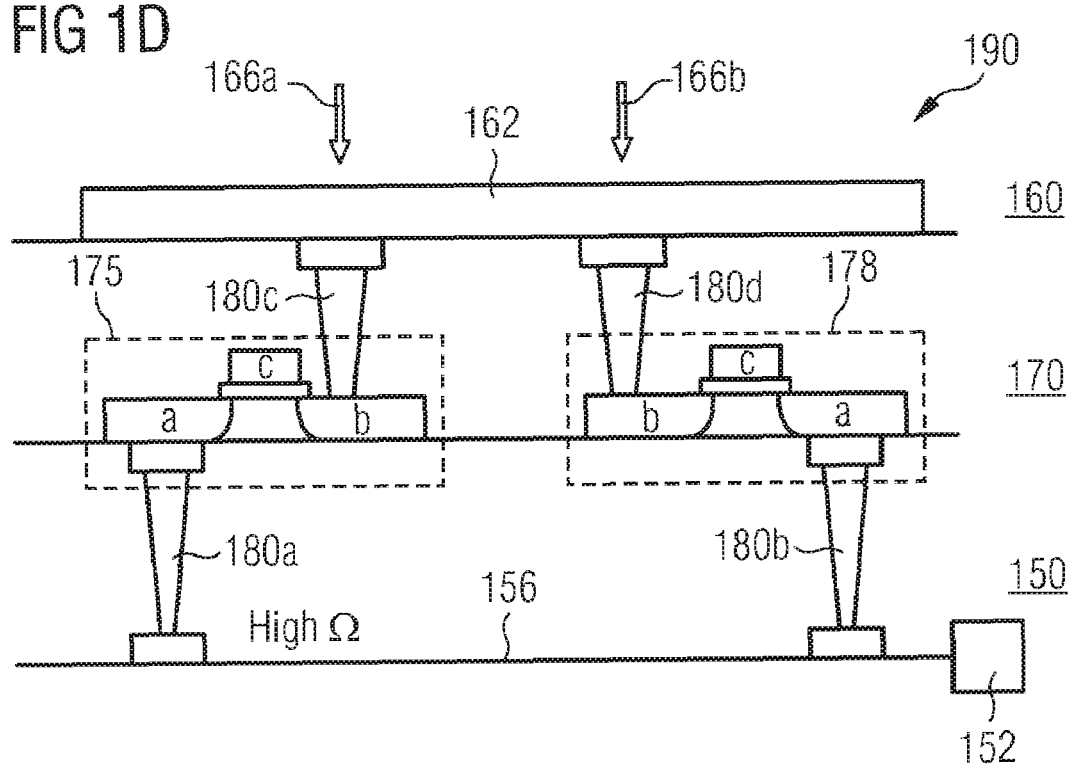

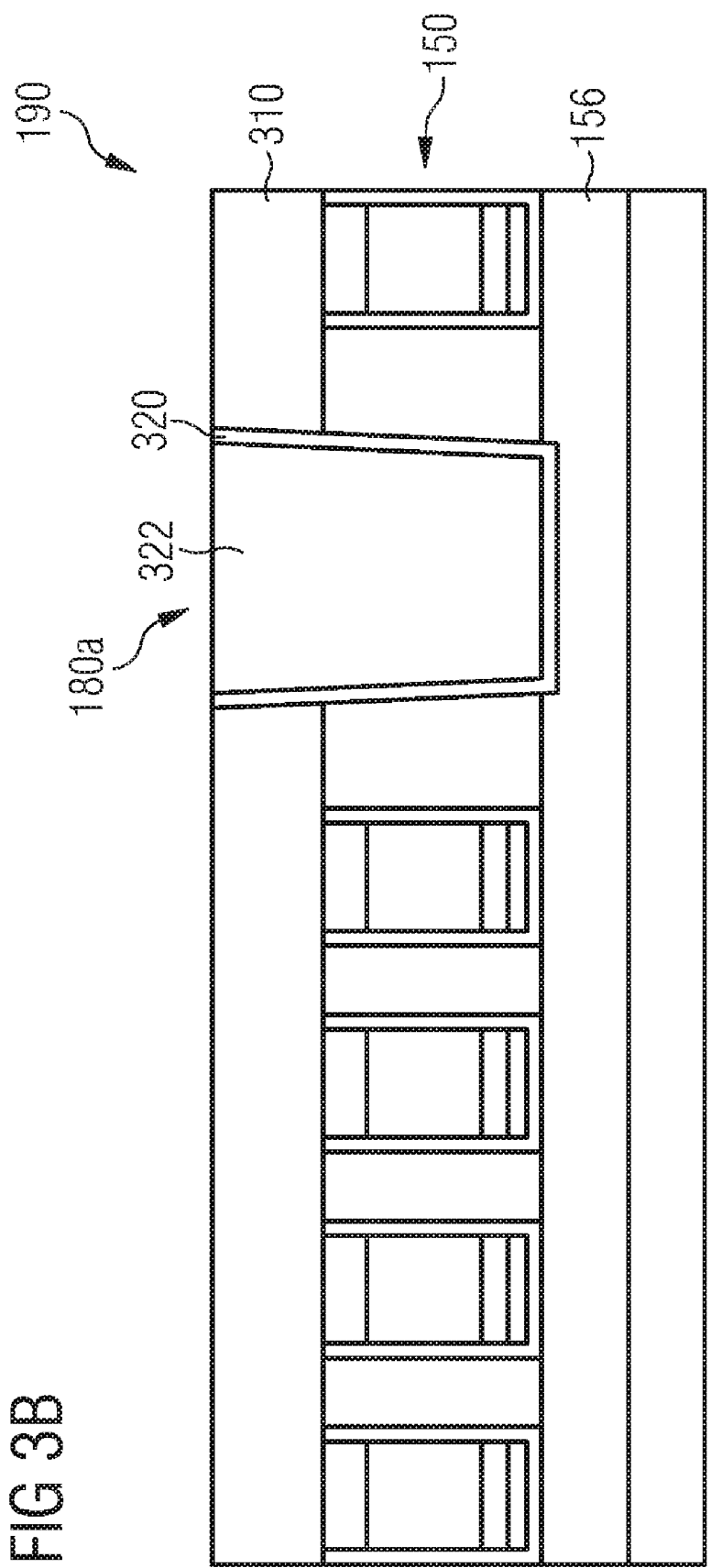

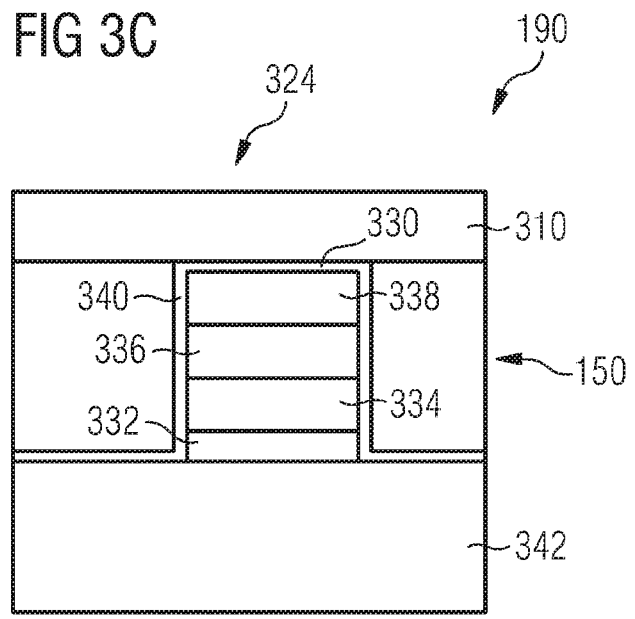
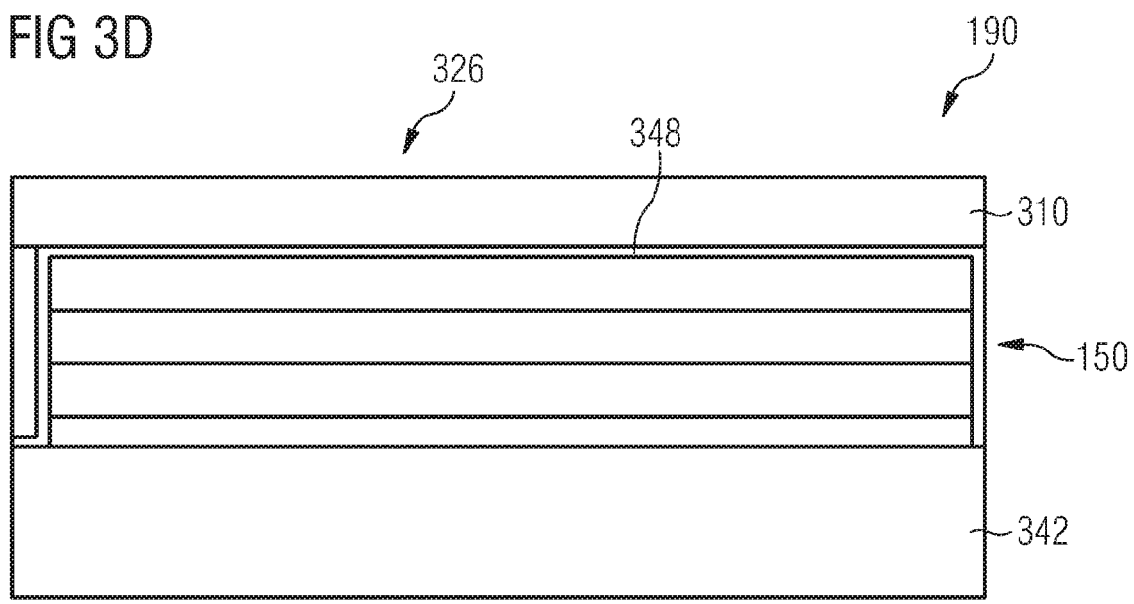

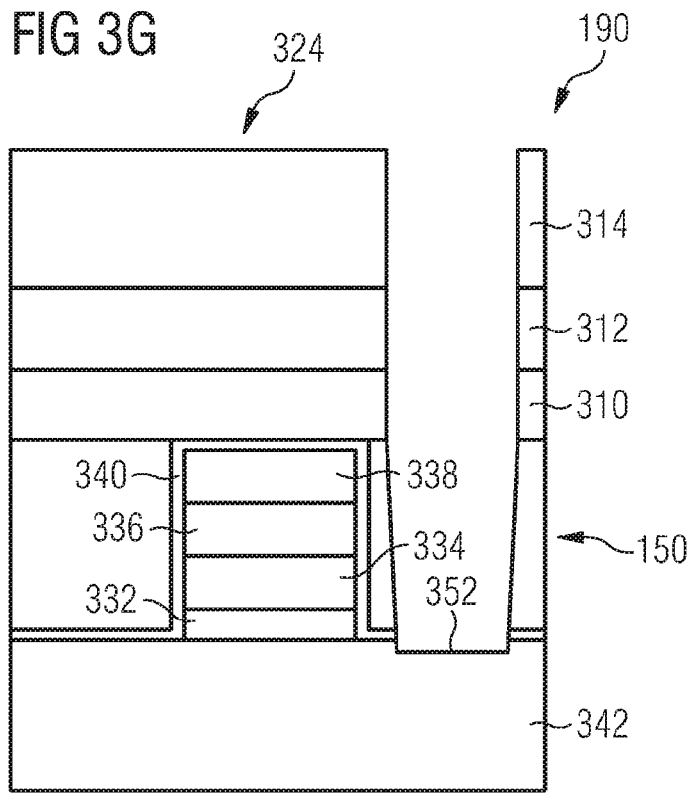
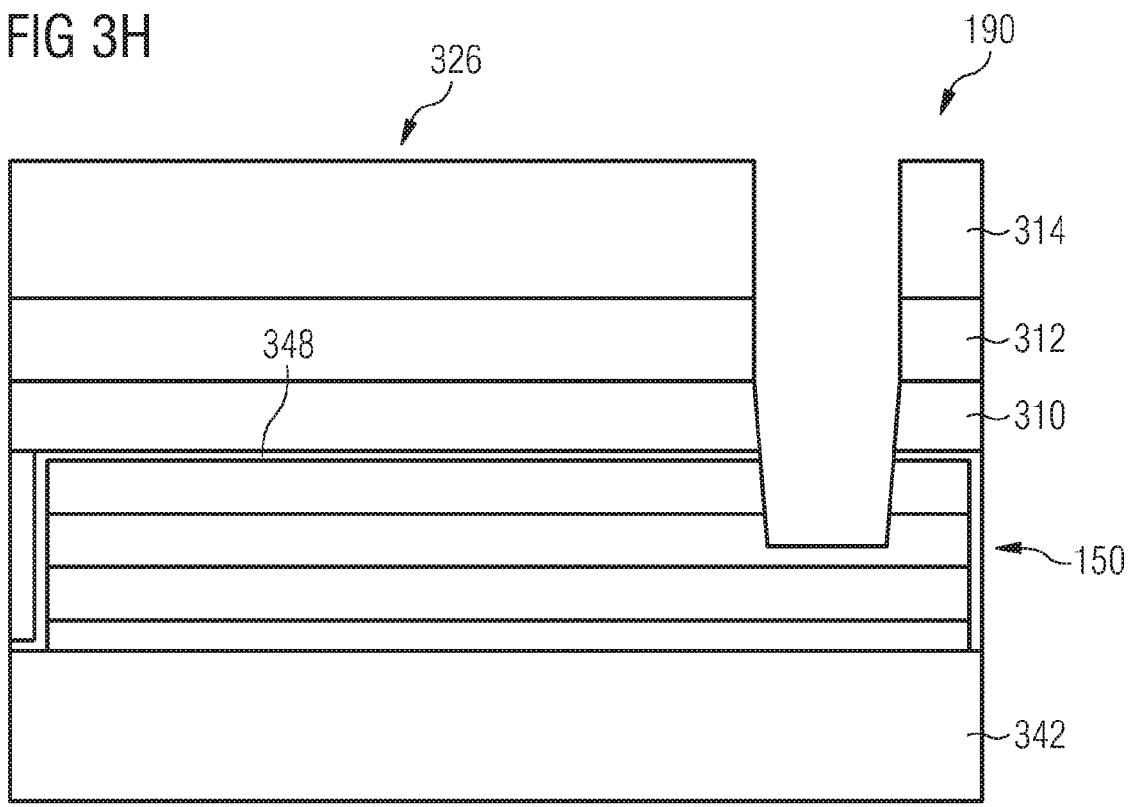

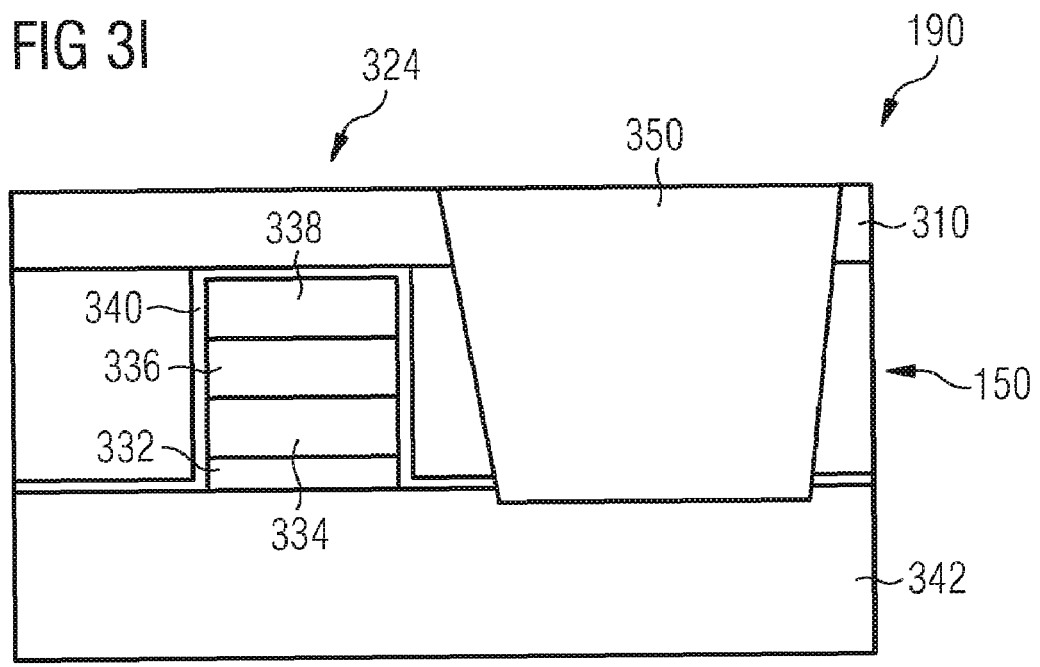
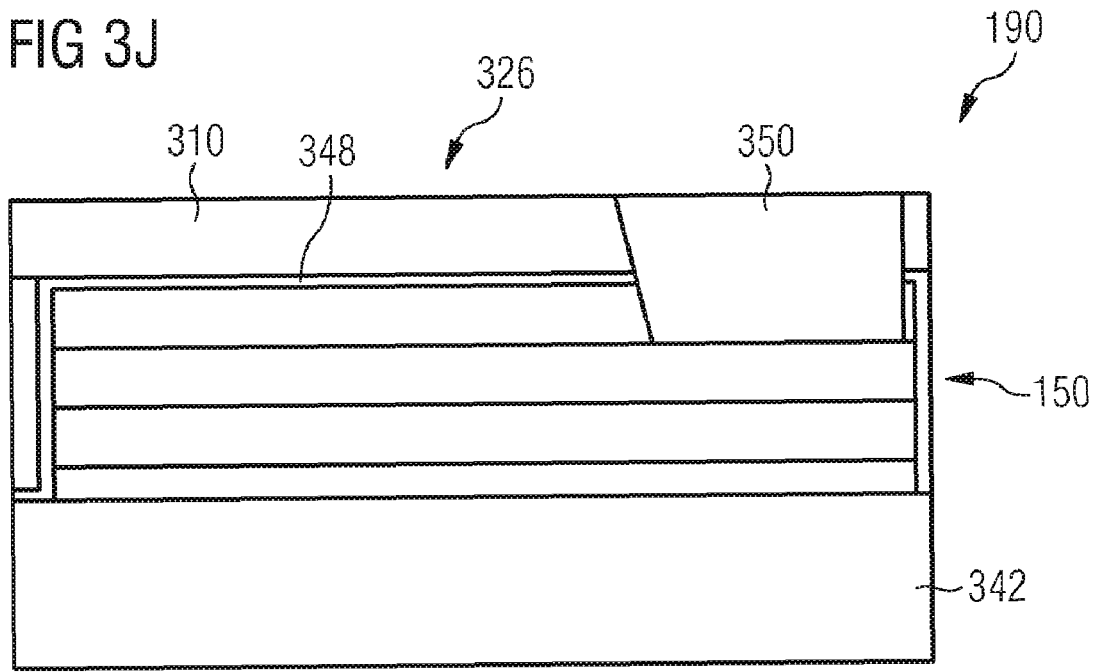

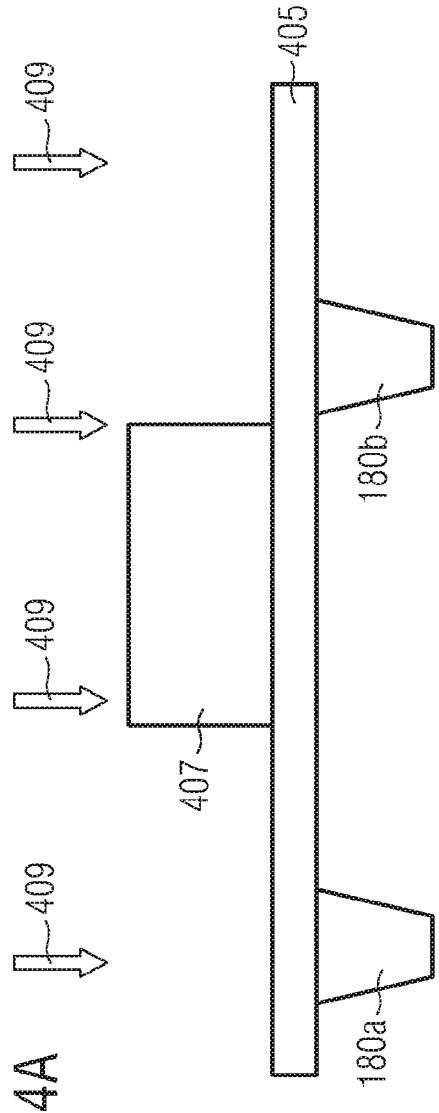
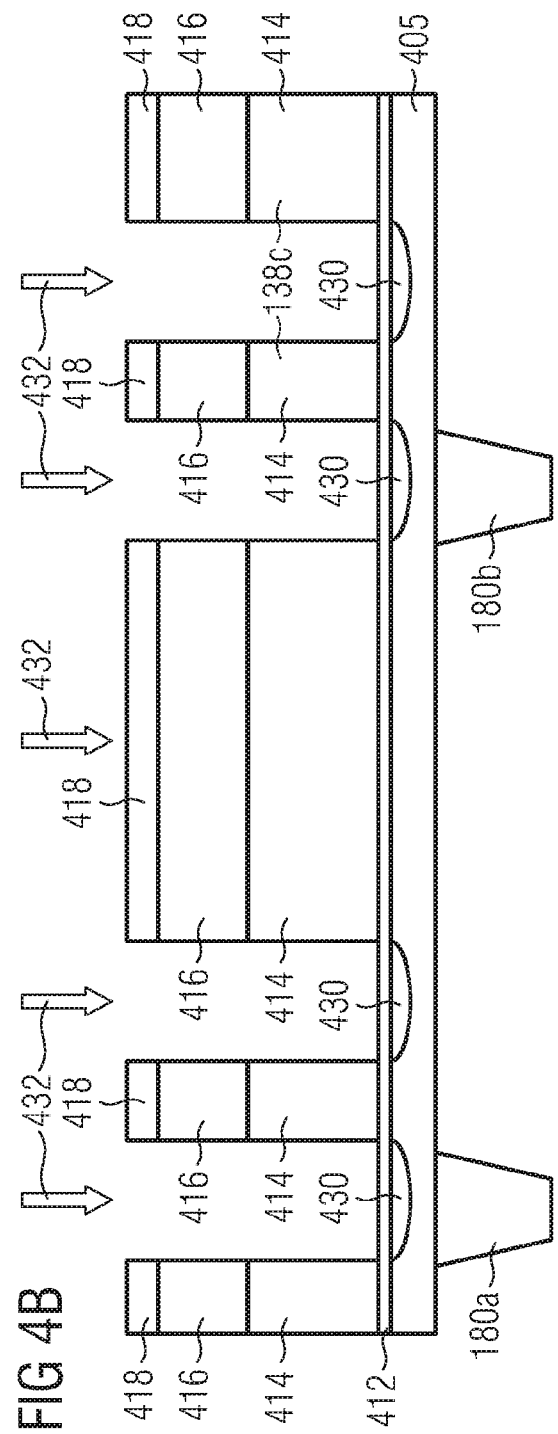

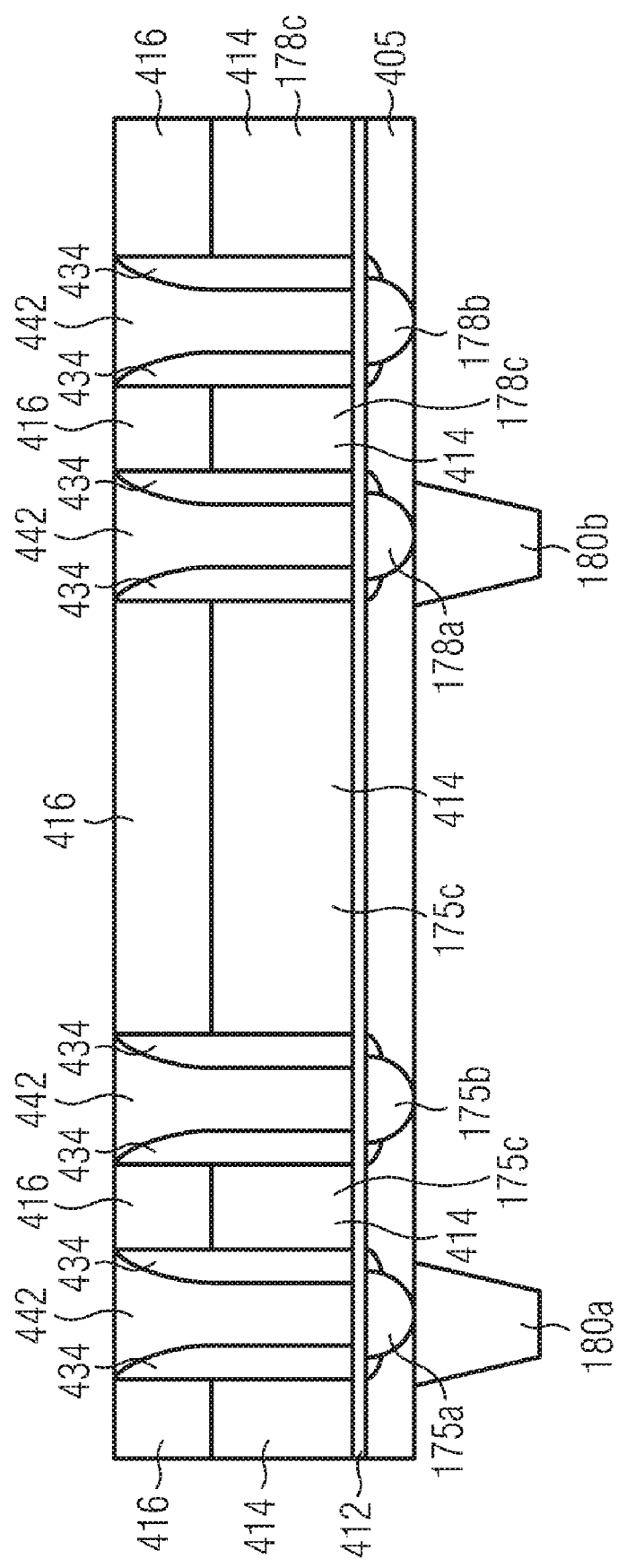

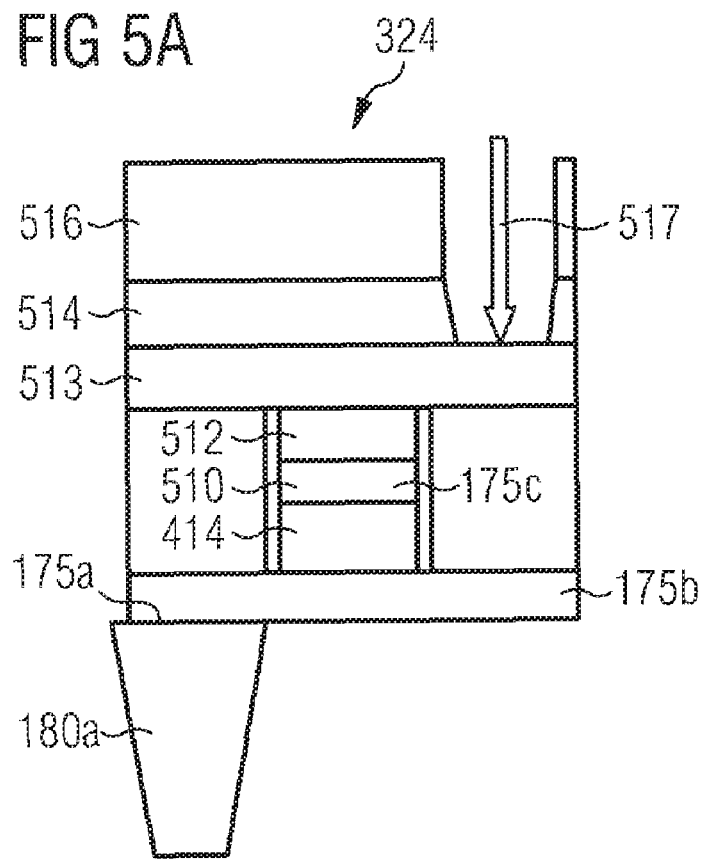
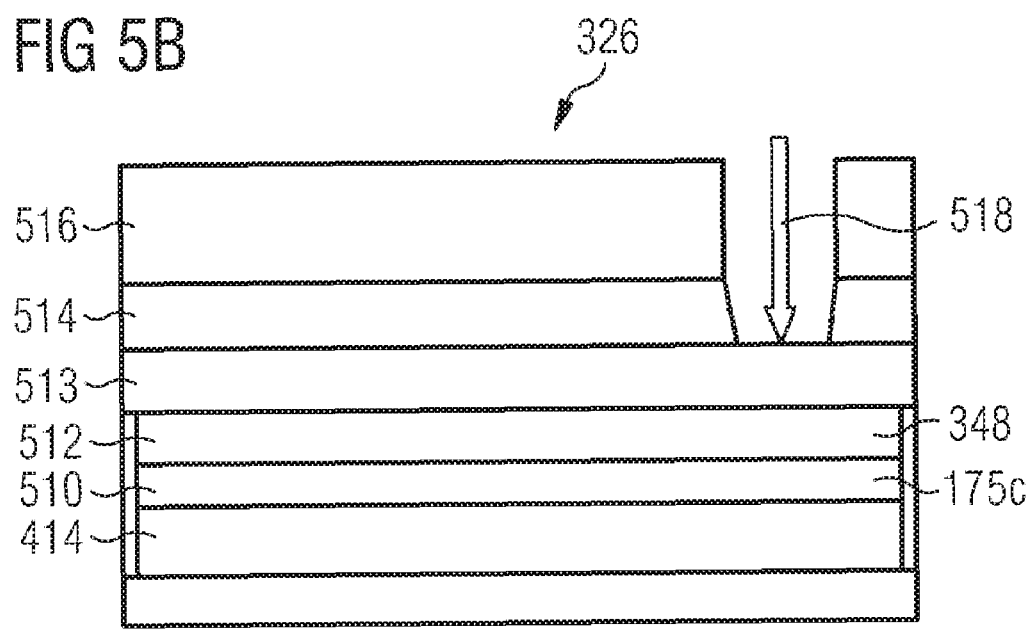

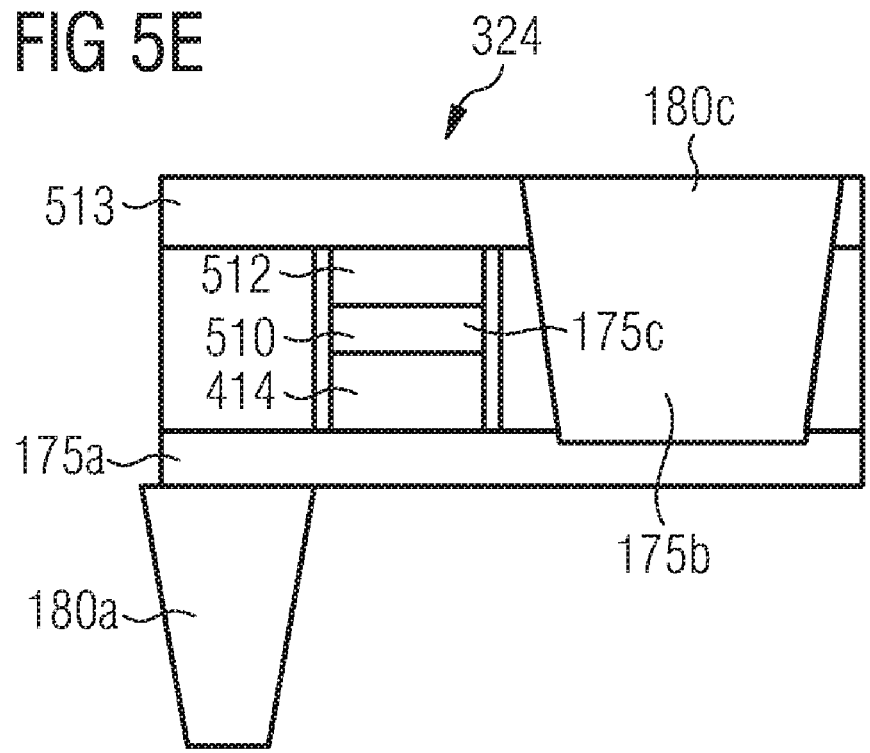
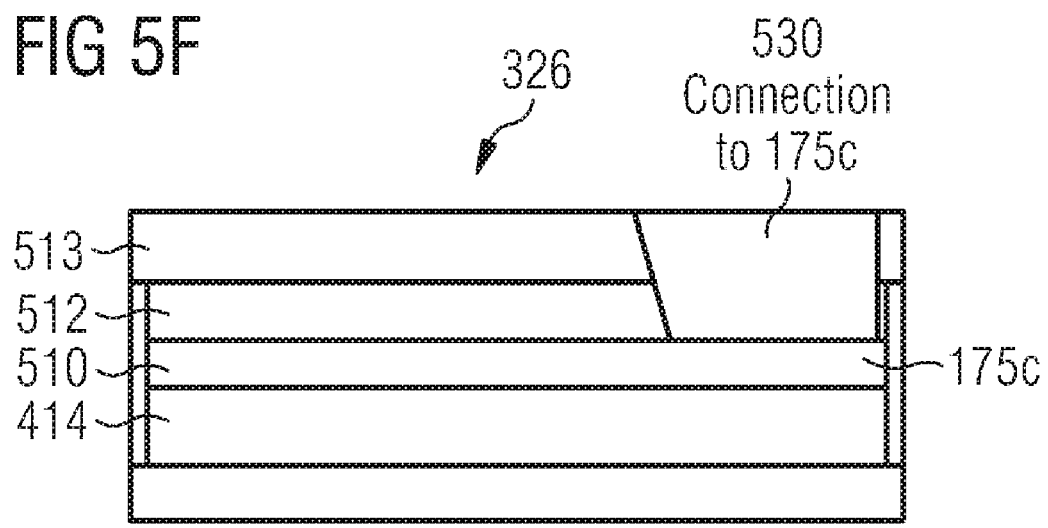

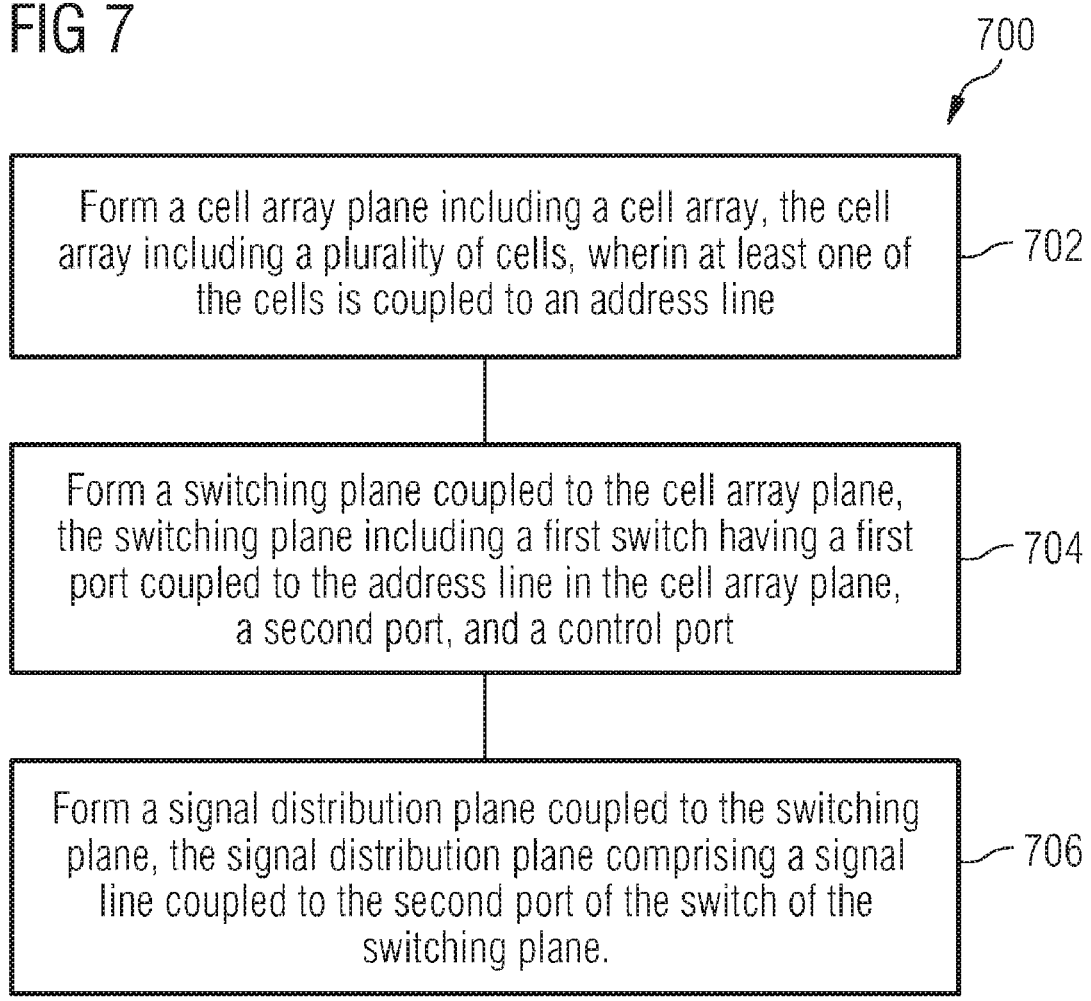

INTEGRATED CIRCUITS, METHODS FOR MANUFACTURING INTEGRATED CIRCUITS, INTEGRATED MEMORY ARRAYS

TECHNICAL FIELD

The present invention relates generally to integrated circuits, to methods for manufacturing integrated circuits, and to integrated memory arrays.

BACKGROUND

Due to their high circuit density, input and output (I/O) connectivity to memory arrays presents significant challenges. In particular, routing lines to and from the memory array becomes difficult as the chip area needed for connections to the array is likely to occupy a large portion of the array area. When such space requirements are multiplied by the number of access points desired on the array, it becomes apparent that the array's density suffers.

In a similar manner, lines within the memory array are also constrained as to their dimensions, particularly their width. Narrow memory array lines impede performance of the memory array as the narrow lines will exhibit excessively high resistivity due to the confined cross-sectional area of the lines themselves. The high resistivity and ohmic loss of the memory array lines combined with the expected programming and erase voltage levels propagating along them creates significant power dissipation and heat. The large amount of power dissipated in the memory array lines will require a higher applied voltage in order to compensate for the array line losses. Furthermore, the propagation delay accompanying the high resistivity of the array lines should be taken into account. In particular, the lines' high resistance results in a significant propagation delay of the applied signals along the array lines to the memory cells, as the R-C (resistance-capacitance) time constant is defined in part by cumulative resistance of array lines. A long propagation delay of the applied signal is deleterious in achieving fast programming, erase, and read operations for the memory cells. Widening or broadening the array lines to reduce the lines' series resistance is not possible in a space-limited, high density array.

Another conventional technique, stitching, in which additional conductive lines are connected to the array line, is also not space efficient, particularly at the high voltage levels seen in non-volatile arrays.

Salicidation represents another conventional process by which array lines are treated to become more conductive, although the level of improvement is rather small.

Accordingly, what is needed is a means by which the resistance of array lines in a high density, non-volatile memory array is reduced.

SUMMARY OF THE INVENTION

One embodiment of the invention provides an integrated circuit that includes a cell array plane comprising a cell array having a plurality of cells, at least one of the plurality of cells coupled to an address line, a signal distribution plane monolithically integrally formed with the cell array plane and having a signal line distributing a signal therealong, and a switching plane monolithically integrally formed with and coupled between the cell array plane and the signal distribution plane, the switching plane having a first switch having a first port (e.g., node) coupled to the signal line in the signal distribution plane, a second port coupled to the address line in the cell array plane, and a control port controlling the conduction state of the switch, the switch being operable to selectively conduct a signal between the signal line and the address line.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1C illustrates a simplified cross-sectional view of a second embodiment of an integrated memory array in accordance with the present invention;

FIG. 1D illustrates a specific embodiment of the integrated array of FIG. 1C in which switches are constructed as field effect transistors in accordance with the present invention;

FIGS. 3A-3J illustrate exemplary processes by which a conductive via is formed coupled to a memory cell in accordance with the present invention;

FIGS. 4A-4C illustrate exemplary processes for constructing a thin film transistor operable as a switch in accordance with the present invention;

FIGS. 5A-5J illustrate exemplary processes by which a conductive via is formed coupled to a signal line in accordance with the present invention;

FIG. 7 illustrates an exemplary method of manufacturing an integrated circuit in accordance with the present invention.

DETAILED DESCRIPTION OF ILLUSTRATIVE EMBODIMENTS

As used herein the terms connected and coupled are intended to include both direct and indirect connection and coupling, respectively.

Figure 1A:
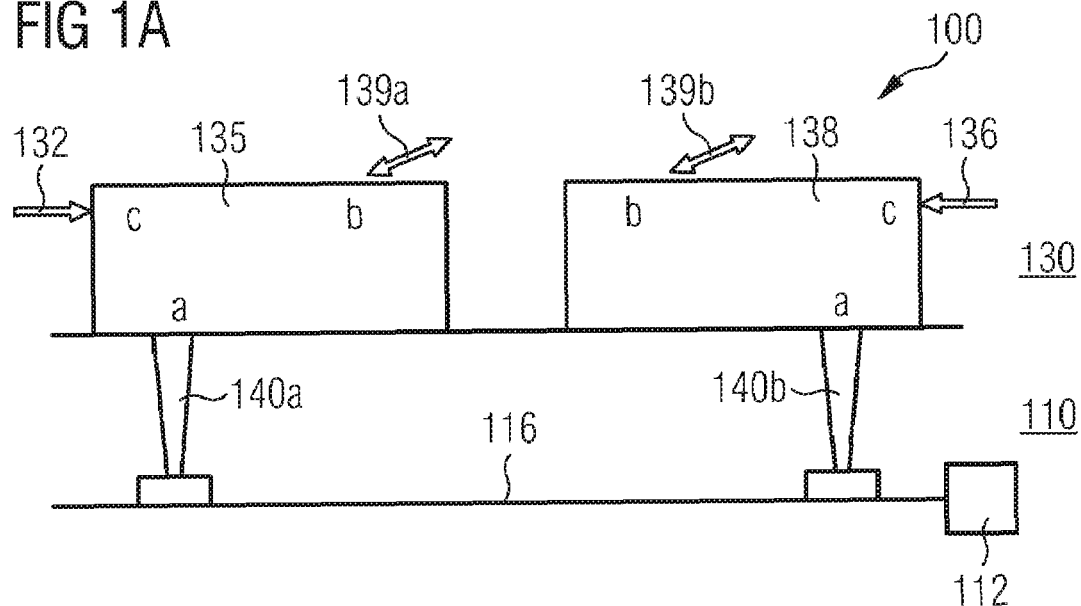
FIG. 1A illustrates a simplified cross-sectional view of a first embodiment of an integrated memory array in accordance with the present invention.

FIG. 1A illustrates a simplified cross-sectional view of a non-volatile memory array 100 with a switching plane being monolithically integrated with the non-volatile memory array 100 in accordance with one embodiment of the present invention. The integrated array 100 includes a memory array plane 110 and a switching plane 130 coupled thereto. In a particular embodiment, planes 110 and 130 are monolithically integrally formed by means of a semiconductor fabrication process, such as those used in the fabrication of Si, $SiO_2$, SiGe, or GaAs based integrated circuits.

The memory array plane 110 includes an array 112 of non-volatile memory cells, at least one of the memory cells within the array 112 coupled to an address line 116. In a particular embodiment, the address line 116 is a bitline or a wordline. In one embodiment of the invention, the memory array plane may include an arbitrary number of address lines. The memory cells within the array 112 may be arranged in any particular architecture, for example, a NOR architecture, or a NAND architecture. Further, the structure of the memory cells within the array 112 may vary, being, for example, a floating gate device, a charge trapping device with, for example, an oxide-nitride-oxide (Nitrided Read Only Memory, NROM), and provide single or multiple-bit storage. The address line 116 may be any line that is used to address or control a memory cell of the array 112.

The switching plane 130 is monolithically integrally formed with the memory array plane 110, the switching plane 130 including a first switch 135 having a first port 135a coupled to the address line 116 in the memory array plane, a second port 135b connecting to a first signal line 139a, and a control port 135c coupled to a first control line 132 providing a control signal of the first switch 135. The switching plane 130 further has a second switch 138 having a first port 138a coupled to the address line 116, a second port 138b coupled to a second signal line 139b, and a control port 138c coupled to a second control line 136 providing a control signal of the second switch 138.

The array 100 further includes a first conductive via 140a coupled between the address line 116 and the first port 135a of the first switch 135, and a second conductive via 140b coupled between the address line 116 and the first port 138a of the second switch 138. The conductive vias 140a and 140b are formed to provide a low ohmic transition to/from the switches 135 and 138. In a particular embodiment, large diameter vias of heavily doped and salicidized poly-silicon are used to construct the conductive vias 140a and 140b. Exemplary processes by which the conductive vias 140a and 140b are formed are described and illustrated below. The type of switches employed in the switching plane 130 can be of various types, for example, diodes, transistors, and similar controllable devices available in the particular semiconductor process employed.

Signal lines 139a and 139b may be used to provide a variety of different interconnection options for the memory array plane 110. As an example, signal lines 139a and 139b may be mutually coupled to provide a low resistance line, which is selectively switched into a parallel arrangement with the address line 116. In such an embodiment, switches 135 and 138 could be rendered conductive to parallel-couple the continuous signal line 139a/139b with the address line 116 to decrease the effective resistance of the address line 116.

In another embodiment, the signal line is an interconnection line. One application could be the separation of a global decoder in a global decoder and a local decoder, which relaxes the layout and processing of the adjacent decoder part. Typical interconnects are between selector groups or selector groups and global wordline/bitline decoder.

Figure 1B:
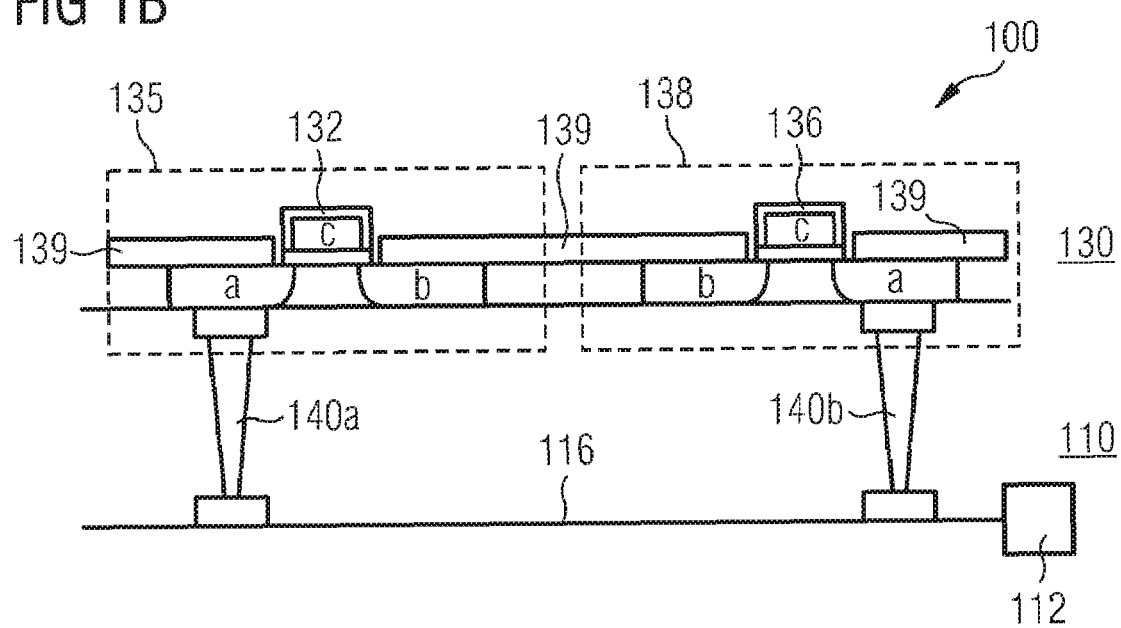
FIG. 1B illustrates a specific embodiment of the integrated memory array of FIG. 1A in which switches are constructed as field effect transistors in accordance with the present invention.

FIG. 1B illustrates a specific embodiment of the integrated memory array 100 shown in FIG. 1A, with previously identified features retaining their reference numbers. As shown, the switches 135 and 138 are constructed as field effect transistors, each switch 135 and 138 having a first source/drain region 135a, 138a, a second source/drain region 135b, 138b, and a gate region 135c, 138c. Control lines 132 and 136 are operable to carry first and second control signals to the first and second switches 135 and 138, respectively, the first and second control signals being operable to control the conduction state of the first and second switches 135 and 138, respectively.

In a particular embodiment, the switching transistors 135 and 138 are constructed as thin film transistors (TFTs), operable, in a particular embodiment, at voltage levels of 3 Volts or higher (e.g., 5 V, 7 V, 10 V, 15 V) in order to supply the voltage levels needed during memory program and erase operations and select gate control operations. The short inter-plane height of the thin film transistors is advantageous in the present invention, as it does not significantly increase the inter-plane height of the integrated array 100. The processes employed to form the thin film switching transistors are further illustrated below.

In one embodiment as illustrated, signal lines 139a and 139b of FIG. 1A are merged into a low resistance conductive line 139 coupled to the first and second port (i.e., the source/drain regions) 135a, b and 138a, b of the first and second transistors 135 and 138, the conductive line 139 being arranged in parallel with the address line 116. By controlling the first and second switches 135 and 138 to a highly conductive on-state, the portion of the low resistance conductive line 139 extending between conductive vias 140a and 140b will be switched in parallel with the relatively high resistance of the address line 116 to provide a lower effective resistance for the address line 116 between the conductive vias 140a and 140b. A lower effective resistance along the address line 116 will result in less propagation delay along the address line 116, as well as lower power dissipation and heating. The decreased propagation delay is advantageous in maintaining fast programming, erase, and read operations of the integrated memory array 110. In view of the relatively high voltage levels supplied to the memory cells within the array 112 during programming and erase operations (>3 V, and typically in the range of 5 V, 7 V, 10 V, 15 V), the decrease in power dissipation of the address line 116 is expected to be substantial.

It will be understood that a similar reduction in the address line's resistance over a longer length can be obtained from activating one or more additional switches (not shown) in either direction along the conductive line 139. In one embodiment, only two switches are used to switch the conductive line 139 in parallel with the address line 116. In another embodiment, three or more switches distributed between the conductive line 139 and the address line 116 are switched to a highly conductive state to provide a low effective resistance for the address line 116.

FIG. 1C illustrates a simplified cross-sectional view of an integrated memory array with switching and signal distribution planes in accordance with one embodiment of the present invention. The integrated memory array 190 includes a memory array plane 150, a signal distribution plane 160, and a switching plane 170 located and coupled therebetween. In a particular embodiment, planes 150, 160 and 170 are monolithically integrally formed by means of a semiconductor fabrication process, an exemplary embodiment of which is further described below.

The memory array plane 150 includes a plurality of memory cells; each of the memory cells is coupled to one or more address lines 156. The memory cells within the array 152 may be arranged in any particular architecture, for example, volatile memory cell architectures, or non-volatile NOR or NAND memory cell architectures. Further, the structure of the memory cells within the array 152 may vary, being, for example, floating gate, charge trapping, e.g., oxide-nitride-oxide, and provide single or multiple-bit storage. The address lines 156, in a particular embodiment, are bitlines or wordlines. In a particular embodiment of the invention, the memory array plane 150 includes select gate cells 154 controlling current flow to a serially coupled plurality of memory cells of a memory cell string, in other words, a NAND string of a plurality of memory cells, included within the memory array 152. In such an embodiment, a second address line 157 (e.g., a select gate control line) is employed to provide a select gate control signal to activate/deactivate these select gate cells 154.

The signal distribution plane 160 includes signal lines 162a and 162b coupled to respective switch connection nodes 166a and 166b. Each of the signal lines 162a and 162b may be routed between different switch connection nodes, to a power supply, or to a load. In a particular embodiment, the signal distribution plane 160 forms the top plane in the integrated memory array 190, and in such an instance the signal lines 162a and 162b, which may be electrically coupled with one another, are composed of highly-conductive upper metal layer materials (also referred to as conductor track metal layer materials), such as W, Al, AlCu, Cu and Ag. Metal layers exhibit substantially higher conductivity than buried metal layers (e.g., the address lines 156 and 157), the metal layers exhibiting a resistivity in the range of 0.04-1 Ohms per square, for example.

The switching plane 170 is monolithically integrally formed with, and coupled between, the memory array plane 150 and the signal distribution plane 160, the switching plane 170 operable to selectively provide the distributed signals to the address lines of memory cells in the array plane 150. As shown in FIG. 1C, the switching plane 170 includes a first switch 175 having a first port 175a coupled to the address line 156 in the memory array plane 150, a second port 175b coupled to the first signal line 162a in the signal distribution plane 160, and a control port 175c for controlling the conduction state of the first switch 175. The switching plane 170 is further shown as having a second switch 178 having a first port 178a coupled to an address line 157, a second port 178b for coupling to the second signal line 162b, and a control port 178c for receiving a control signal.

The integrated memory array 190 further includes a first conductive via 180a coupled between the first address line 156 and the first port 175a of the first switch 175, a second conductive via 180b coupled between the second address line 157 and the first port 178a of the second switch 178, a third conductive via 180c coupled between the first signal line 162a and the second port 175b of the first switch 175, and a fourth conductive via 180d coupled between the second signal line 162b and the second port 178b of the second switch 178. The type of switches employed in the switching plane 170 can be of various types, for example, diodes, transistors, and similar controllable devices available in the particular semiconductor process employed. The conductive vias 180a, 180b, 180c, 180d are formed to provide a low ohmic transition to/from the switches 175 and 178. In a particular embodiment, large diameter vias of heavily doped and salicidized poly-silicon are used to construct the conductive vias 180a, 180b, 180c, 180d. Exemplary processes by which the conductive vias 180a, 180b, 180c, 180d are formed are described and illustrated below.

FIG. 1D illustrates a specific embodiment of the integrated memory array 190 shown in FIG. 1C, with previously identified features retaining their reference numbers. As shown, the switches 175 and 178 are constructed as field effect transistors, each switch 175 and 178 having a first source/drain region 175a, 178a, a second source/drain region 175b, 178b, and a gate region 175c, 178c. Control ports (gate regions) 175c, 178c are operable to receive control signals to control the conduction state of the first and second switches 175 and 178. In a particular embodiment, the switching transistors 175 and 178 are constructed as thin film transistors, operable, in a particular embodiment, at voltage levels of 3 volts or higher (e.g., 5 V, 7 V, 10 V, 15 V) in order to supply the voltage levels needed during memory program and erase operations and select gate control operations. The short inter-plane height of the thin film transistors is advantageous in the present invention, as it does not significantly increase the inter-plane height of the integrated memory array 190. The processes employed to form the thin film switching transistors are further illustrated below.

In the exemplary embodiment shown, the signal distribution plane 160 is disposed above the switching plane 170, and the switching plane 170 is disposed above the memory array plane 150. In an alternative embodiment, the positions of the memory array plane 150 and the signal distribution plane 160 is reversed, such that the memory array plane 150 is the top layer, and the signal distribution plane 160 is the bottom plane.

In one embodiment as illustrated, a low resistance conductive line 162 is coupled along the first and second port (i.e., the source/drain regions) 175a, 175b and 178a, 178b of the first and second transistors 175 and 178, the conductive line 162 being arranged in parallel with the address line 156. By controlling the first and second switches 175 and 178 to a highly conductive on-state, the portion of the low resistance conductive line 162 extending between conductive vias 180c and 180d will be switched in parallel with the relatively high resistance of the address line 156 to provide a lower effective resistance for the address line 156 between the conductive vias 180a and 180b. A lower effective resistance along the address line 156 will result in less propagation delay along the address line 156, as well as lower power dissipation and heating. The decreased propagation delay is advantageous in maintaining fast programming, erase, and read operations of the integrated memory array 190. In view of the relatively high voltage levels supplied to the memory cells within the array 152 during programming and erase operations (>3 V, and typically in the range of 5V, 7 V, 10V, 15V), the decrease in power dissipation of the address line 156 is expected to be substantial.

It will be understood that a similar reduction in the address line's resistivity over a longer length can be obtained from activating one or more additional switches (not shown) in either direction along the conductive line 162. In one embodiment, only two switches are used to switch the conductive line 162 in parallel with the address line 156. In another embodiment, three or more switches distributed between the conductive line 162 and the address line 156 are switched to a highly conduction state to provide a low effective resistance for the address line 156.

Figure 2A:
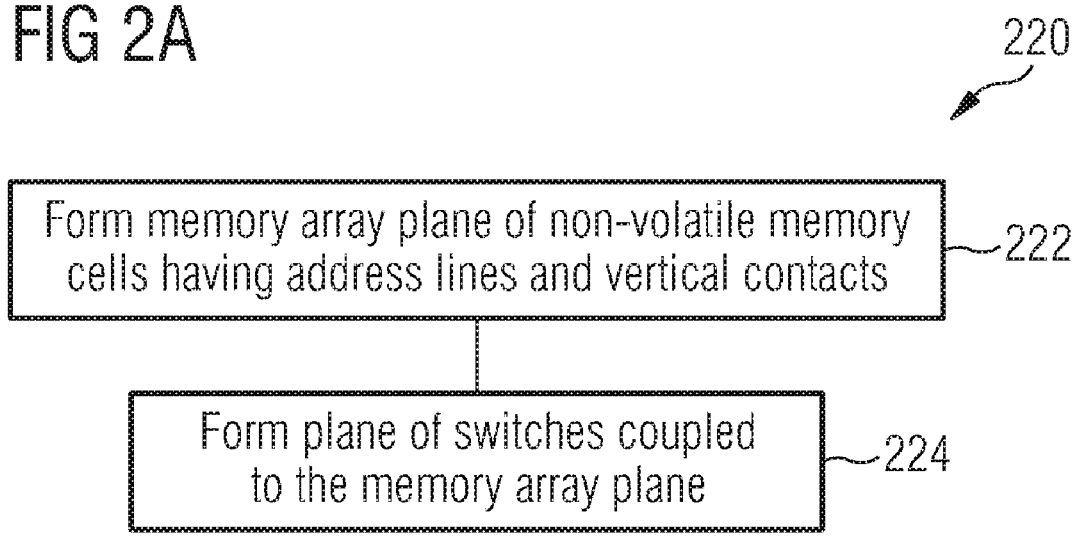
FIG. 2A illustrates an exemplary method of forming the integrated memory array of FIG. 1A in accordance with the present invention.

FIG. 2A illustrates an exemplary method 220 of forming the memory array 100 in accordance with the present invention. In a particular embodiment, the integrated memory array 100 is constructed using semiconductor processing techniques, such as those used in the fabrication of $SiO_2$, SiGe, GaAs integrated circuits. As those skilled in the art will appreciate, other semiconductor processing technologies may be used as well. It is to be further appreciated that the sequence of the manufacturing operations is exemplary, and the ordering of the processes will differ from that shown in particular manufacturing embodiments.

At 222, a memory array plane 110 is formed, the memory array plane 110 including an array 112 of non-volatile memory cells, at least one memory cell coupled to an address line 116. At 224, a switching plane 130 is formed, the switching plane 130 including at least one first switch 135 having a first port 135a coupled to the address line 116, a second port 135b coupled to a signal line 139a, and a control port 135c coupled to a control line 132, the control port 135c being operable to control (via a control signal received along the control line 132) the conduction state of the switch 135.

In a particular embodiment of process 222, the memory array 112 is a Flash EEPROM memory array, and further, e.g., a NAND Flash memory array in which select gates are employed to selectively provide bitline signals to NAND memory cell strings including a plurality of memory cells being coupled in series with one another via their respective source/drain regions. In such an instance, a second address line 157, including a select gate control line, is further included in the formation of the memory array plane 110. The address line 116 may be a bitline, a wordline, and gate dielectric control lines in particular embodiments, as described above.

In a particular embodiment of process 224, the first conductive via 140a is formed coupled between the address line 116 and the first port 135a of the switch. Exemplary embodiments of these processes are described and illustrated below.

Further with regard to process 224, the first switch 135 is formed as a field effect transistor, the first and second ports 135a and 135b thereof being respective first and second source/drain regions of the field effect transistor, and the control port 135c being the gate region of the field effect transistor. Further, the first switch 135 is formed as a thin film transistor having a low thickness profile. Exemplary processes by which the first switch 135 is constructed as a thin film transistor is further illustrated below.

Further optionally, process 224 includes forming a second switch 138, the second switch 138 having a first port 138a coupled to an address line 116 or 157, a second port 138b coupled to a second signal line 139b, and a control port 138c coupled to a control line 136, the control port 138c being operable to control (via a control signal received along the control line 136) the conduction state of the second switch 138. In such an embodiment, process 224 further includes the formation of a second conductive via 140b coupled between an address line 116 or 157 and the first port 138a of the switch. Exemplary embodiments of these processes are described and illustrated below.

Still further optionally, the first and second signal lines 139a and 139b form a continuous low resistivity line 139 that can be switched in parallel to the address line 116 by means of the first and second transistors 135 and 138. Furthermore, additional transistors (not shown) may be formed within the switching plane and coupled between the conductive line 139 and the address line 116 for providing additional coupling connections therebetween.

Figure 2B:
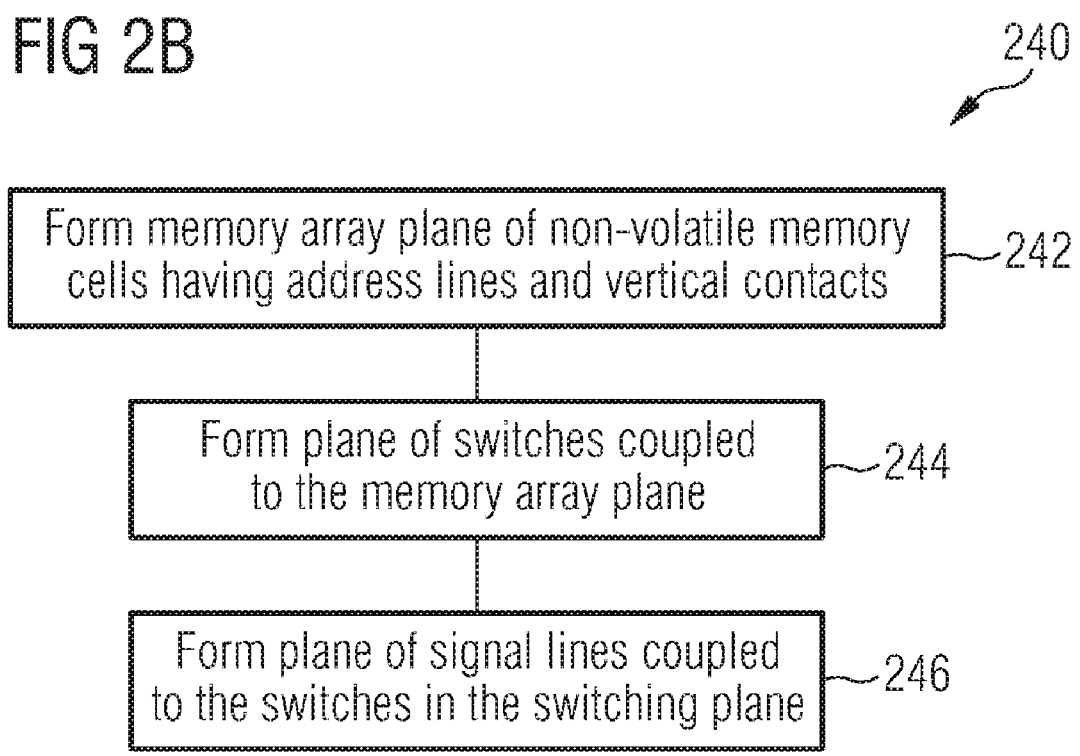
FIG. 2B illustrates an exemplary method of forming the integrated memory array of FIG. 1C in accordance with the present invention.

FIG. 2B illustrates an exemplary method 240 of forming the integrated memory array 190 in accordance with the present invention. In a particular embodiment, the integrated memory array 190 is constructed using semiconductor processing techniques, such as those used in the fabrication of $SiO_2$, SiGe, GaAs integrated circuits. As those skilled in the art will appreciate, other semiconductor processing technologies may be used as well. It is to be further appreciated that the sequence of the manufacturing operations is exemplary, and the ordering of the processes will differ from that shown in particular manufacturing embodiments.

At 242, a memory array plane 150 is formed, the memory array plane 150 including an array 152 of a plurality of memory cells, at least one memory cell coupled to an address line 156. At 244, a switching plane 170 is formed coupled to the memory array plane 150, the switching plane 170 including at least one first switch 175 having a first port 175a coupled to the address line 156, a second port 175b, and a control port 175c. At 246, a signal distribution plane 160 is formed, the signal distribution plane 160 having at least one signal line (e.g., 162a) coupled to the second port 175b of the first switch 175.

Referring to the process of 242, the address line 156 may be a bitline, a wordline, a gate dielectric control line, for example. In one embodiment of the invention, the memory array 152 is constructed as a non-volatile memory array, and further particularly, a NAND Flash memory array in which a select gate 154 or an array of select gates 154 is employed to selectively provide a bitline signal to a NAND memory cell string including, e.g., a plurality of NAND-coupled memory cells within the memory array 152. In such an instance, a second address line 157, consisting of a further select gate control line, is further included in the formation of the memory array plane 150. In another embodiment of the invention, the memory array 112 or 152 is constructed as a charge trapping device array, for example, NROM or SONOS (Silicon-Oxide-Nitride-Oxide-Silicon).

In a particular embodiment of process 244, a first conductive via 180a is formed coupled between the address line 156 and the first port 175a of the switch. Exemplary embodiments of these processes are described and illustrated below.

Further with regard to process 244, the first switch 175 is formed as a field effect transistor, the first and second ports 175a and 175b thereof being respective first and second source/drain regions of the field effect transistor, and the control port 175c being the gate region of the field effect transistor. Further, the first switch 175 is formed as a thin film transistor having a low thickness profile. Exemplary processes by which the first switch 175 is constructed in the form of a thin film transistor are further illustrated below.

Further optionally, process 244 includes forming a second switch 178, the second switch 178 having a first port 178a coupled to an address line 156, a second port 178b coupled to a second signal line 162b, and a control port 178c for receiving a control signal to control the conduction state of the switch 178. Additionally included in processes 242 and 244 in this embodiment is the formation of a second conductive via 180b coupling the address line 156 and the first port 178a of the second switch 178. Exemplary embodiments of these processes are described and illustrated below.

Still further optionally, the first and second signal lines 162a and 162b form a low resistivity signal line 162 that can be switched in parallel to the address line 156 by means of the first and second transistors 175 and 178. Furthermore, additional transistors (not shown) may be formed within the switching plane and coupled between the conductive signal line 162 and the address line 156 for providing additional coupling connections therebetween.

In a particular embodiment of process 246, a third conductive via 180c is formed coupled between the second port 175b of the first switch 175 and signal line 162a or 162. When a second switch 178 is implemented, process 246 may further include formation of a fourth conductive via 180d coupled between the second port 178b of the second switch 178 and the signal line 162b or 162. Exemplary embodiments of these processes are described and illustrated below.

Further with regard to process 246, the signal distribution plane 160 is formed as a top layer of the array 152, and the signal lines 162a and 162b are constructed from metal materials, such as W, Al, AlCu, Cu and Ag. Other highly conductive materials available in the particular fabrication process may be alternatively used.

Still further optionally in process 246, signal lines 162a and 162b may be formed as a continuous conductive line 162, using, for example, metal materials available from the particular semiconductor process employed.

In one embodiment of the manufacturing process, the memory array plane 150 is constructed first, with the switching plane 170 formed vertically above and horizontally overlapping (at least partially) the memory array plane 150. Subsequently, the signal distribution plane 160 is formed vertically above and horizontally overlapping (at least partially) the switching plane 170. In an alternative embodiment, the signal distribution plane 160 is constructed as the bottom layer and the memory array plane 150 is formed as the top layer, with the switching plane 170 occupying the middle layer sandwiched between the signal distribution plane 160 and the memory array plane 150.

FIGS. 3A-3J illustrate exemplary processes by which a conductive via is formed coupled to memory cells in accordance with the present invention. In the illustrated embodiment, the memory array plane 150 occupies the bottom layer of the integrated memory array 190. Prior to following processing steps, the memory array plane 150 (i.e., memory array 152 of cells, select gate 154, address lines 156 and 157) have been formed, and an intermetal dielectric layer (ILD) 310 is deposited thereover.

Figure 3A:
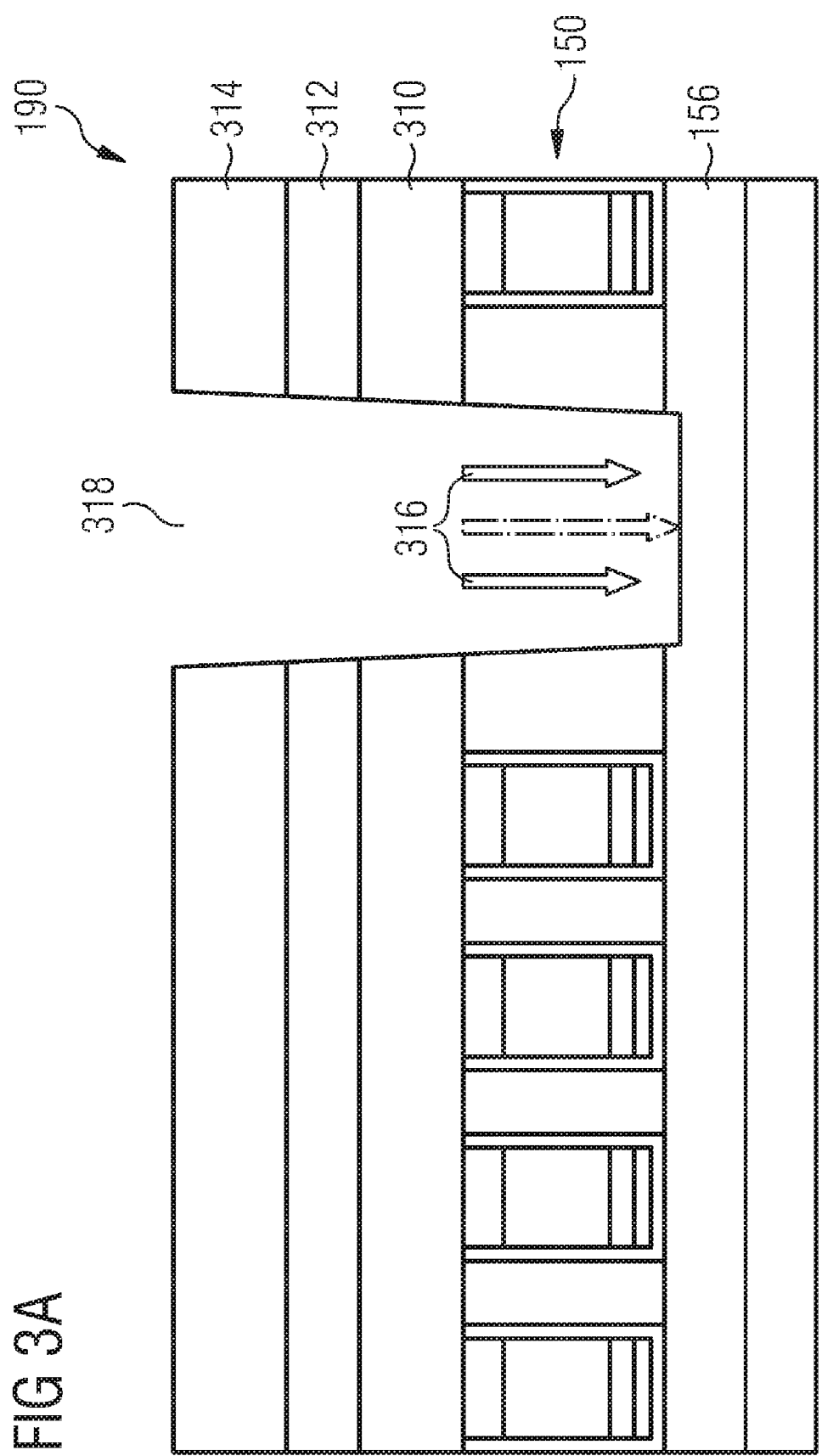

FIGS. 3A and 3B illustrate exemplary processes for forming the first conductive via 180a to contact an address line 156, the address line 156 in the illustrated embodiment being a buried bitline of the memory array 152. Initially, an auxiliary mask, e.g., a hardmask (e.g., $Si_3N_4$, in alternative embodiments of the invention made of any other suitable material made of $SiO_2$, carbon, etc.) 312 is disposed above the top ILD layer 310 of the memory array. Subsequently, photoresist 314 is deposited on the hardmask 312, and the area in which the exposed first contact via 180a will be formed, is developed. Next the hardmask 312, ILD 310, and the ILD of the memory array plane 150 are etched away until the bitline 156 is reached, in other words, exposed. In one embodiment of the invention, the bitline 156 is buried below an isolating layer of the substrate (e.g., $SiO_2$) of the memory array 152, in which case etching is discontinued at the $SiO_2$ boundary of the bitline 156 or slightly therebelow to ensure electric contact with the bitline 156. The resulting structure is shown in FIG. 3A.

After having carried out a contact implant process (symbolized by means of arrows 316, the material of the first contact via 180a to be formed is deposited within the etched via 318, and the overfilling material is removed using, e.g., a CMP process. In one embodiment of the invention, first, a thin liner layer 320, e.g., made of tantalum or tantalum nitride or titanium or titanium nitride, is deposited on the sidewalls and the bottom of the etched via 318. Next, contact plug material 322 such as polysilicon is deposited on the liner layer 320, thereby forming the first contact via 180a. The photoresist mask 314 and hardmask 312 layers are removed. The resulting structure is shown in FIG. 3B.

FIGS. 3C to 3J illustrate exemplary processes for forming the first conductive via 180a to contact an address line 156, the address line 156 in the illustrated embodiment being a wordline of the memory array 152.

The cross-sectional views show two regions, namely a first region 324 (in FIGS. 3C, 3E, 3G, 3I) and a second region 326 (in FIGS. 3D, 3F, 3H, 3J).

Figure 6:
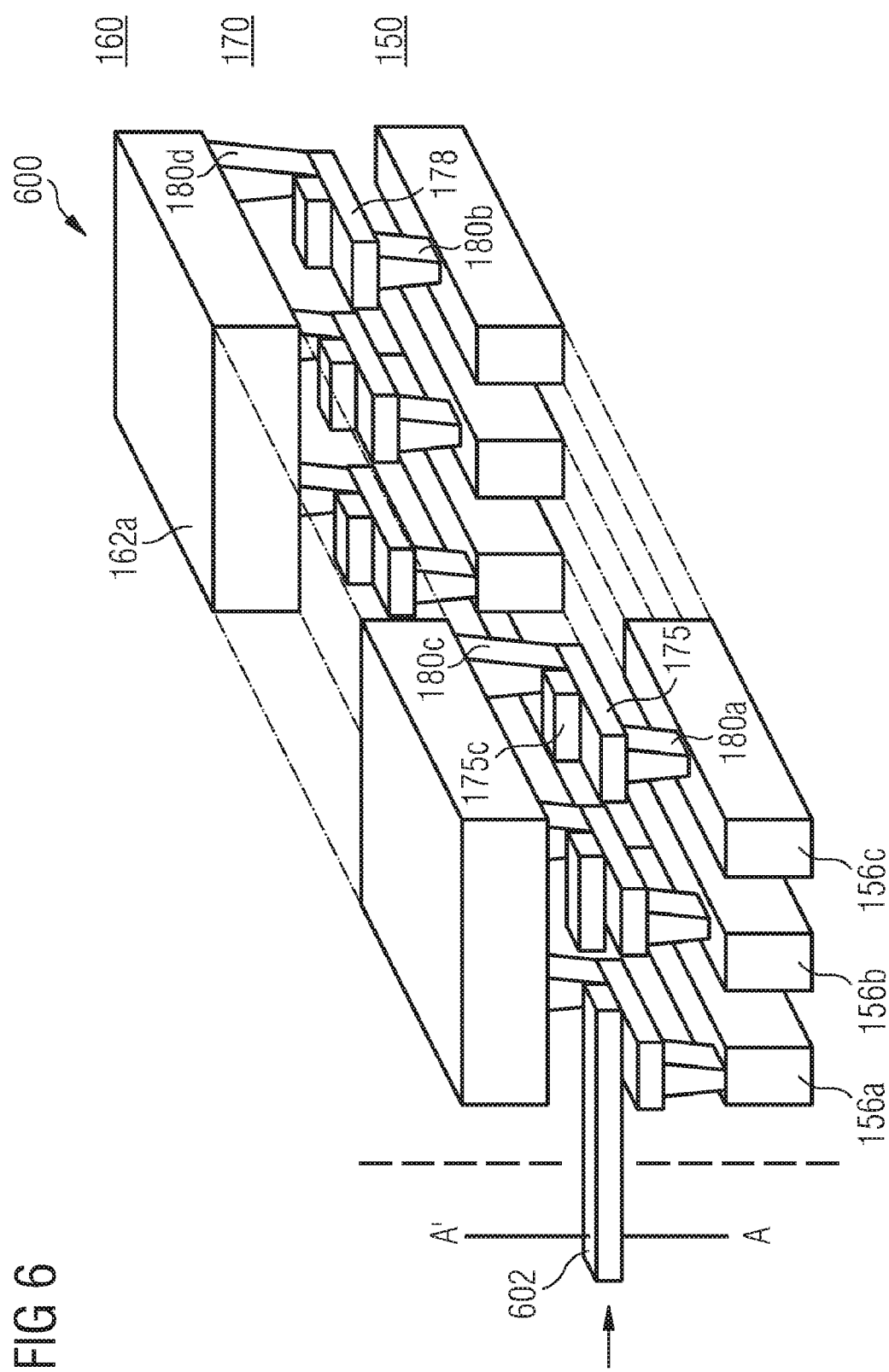
FIG. 6 illustrates a perspective view of an exemplary integrated memory array in accordance with the present invention.

The second region 326 illustrates a cross-sectional view through the wordline at a fan-out region 602 as illustrated with a section line A-A' in FIG. 6.

The first region 324 includes a plurality of memory cells 330 of the memory array 152, wherein only one memory cell 330 is shown in FIGS. 3C to 3J. The memory cells 330 are coupled with each other in a serial connection via their source/drain regions, thereby forming one or more NAND strings of memory cells 330. Each NAND string of memory cells 330 extends in its serial connection perpendicular to the paper plane of FIGS. 3C to 3J. As shown in the cross-section of one memory cell 330 in the first region 324, each memory cell 330 includes a charge storage layer structure, in one embodiment of the invention, a charge trapping layer structure, above an active area of a substrate 342, e.g., p-doped silicon. In an alternative embodiment of the invention, the charge storage layer structure is formed by a floating gate layer structure. In one embodiment of the invention, the charge trapping layer structure is formed by a structure of two, three or more dielectric layers that are selected such that charge carriers can be trapped in one or more of the dielectric layers in a non-volatile manner. In one embodiment of the invention, the charge trapping layer structure is formed by an ONO (Oxide-Nitride-Oxide) layer structure 332. Next, a control gate layer 334 made, e.g., of polysilicon is deposited on the ONO layer structure 332. A wordline 336 is deposited on the control gate layer 334, the wordline 336 being made of, e.g., tungsten or tungsten silicide. A passivation layer 338 made of, e.g., silicon nitride is deposited on the wordline 336. The wordline 336 runs in a direction that is perpendicular to the paper plane of FIGS. 3C to 3J. A further passivation layer 340 made of, e.g., silicon nitride is deposited on the structured stack that is formed by the above-described layers 332, 334, 336, 338.

The second region 326 illustrates a region in which a landing pad is formed in the fan-out region 602 of the memory array 152, which has the same general structure as the memory cell 330 (see FIG. 3D).

Figure 3E:
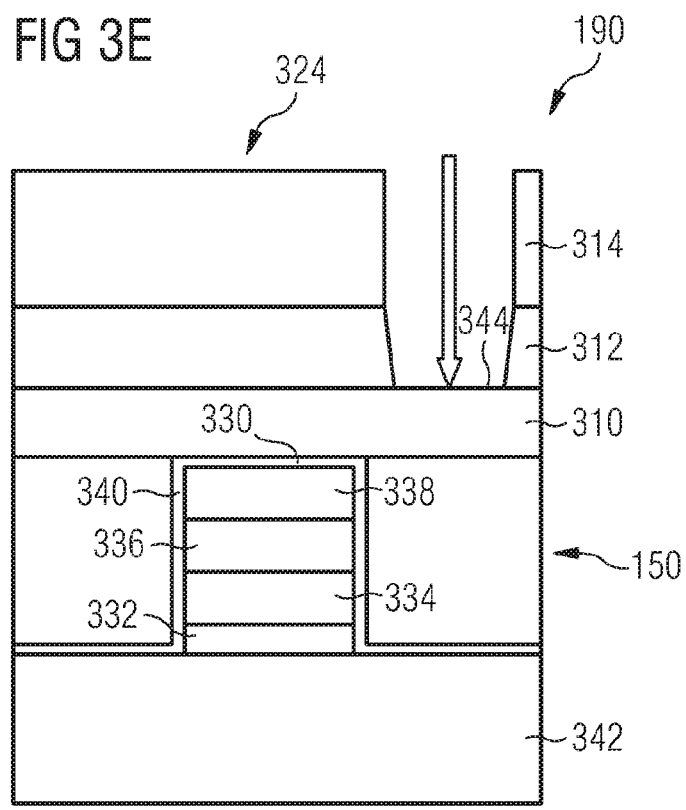

Referring now to FIG. 3E, an electric contact to a source/drain region of each memory cell 330 is needed in order to connect the memory cell 330. As described above, electric contact, e.g., to the bitline 156 is made via the source/drain regions of the memory cell 330. The bitline contact may be needed to provide a bitline voltage either to the memory cell 330 or to a string of memory cells (not shown) coupled to the bitline 156.

Figure 3F:
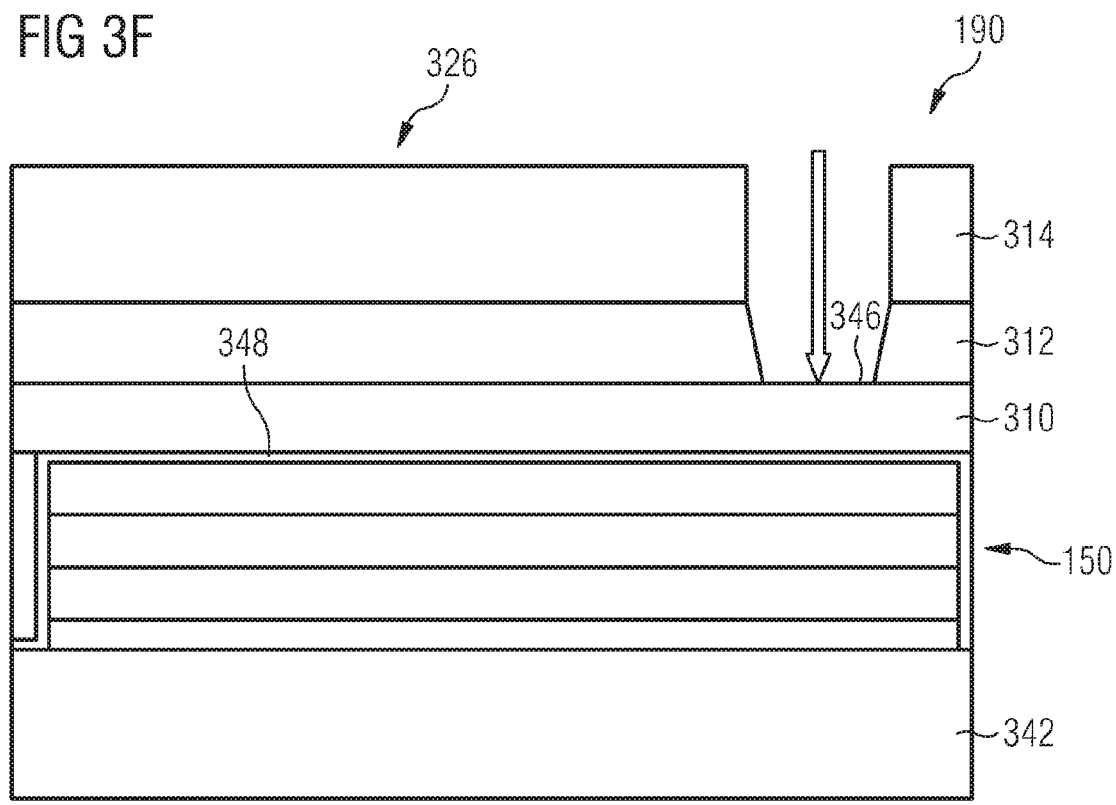

Referring now to FIG. 3F, an electric contact to the gate stack of each memory cell 330 is needed in order to control the conduction state of the memory cell 330. As described above, electric contact, e.g., to the wordline is made via the gate stack of the memory cell 330. The wordline contact may be needed to provide a wordline voltage to the memory cell 330.

In order to manufacture the bitline contact and the wordline contact, a hardmask (e.g. made of $Si_3N_4$) 312 is disposed above the top ILD layer 310 of the memory array 152. Subsequently, photoresist 314 is patterned across the hardmask, and areas of the upper surface of the hardmask 312 are exposed over which the first contact via 180a, in this case the bitline contacts, is deposited. Furthermore, areas of the upper surface of the hardmask 312 are exposed over which the further contact via to contact the landing pads for the wordlines is deposited. Next, the hardmask 312 is etched until surface areas 344 and 346 of the ILD layer 310 of the memory array 152 are reached. The resulting structure is shown in FIG. 3E and in FIG. 3F.

Next, further etching is provided until the etched channel reaches the implanted region in the source/drain area 352 of the memory cell 330 (see FIG. 3G) or the respective landing pad 348 of the wordline in the fan-out region 602 (see FIG. 3H). The resulting structure is shown in FIG. 3G and FIG. 3H.

Next, the photoresist mask 314 and the hardmask 312 are removed. The exposed bitline contacts are annealed for preparation of the conductive via 180a. The exposed areas are cleaned (e.g., by means of wet clean), and the conductive via material 350 (e.g., a liner layer and polysilicon may be used as described above), is deposited within the holes to form the bitline contact vias as well as the landing pad vias. The top surface is planarized using, e.g., a CMP process using the ILD 310 as a CMP stop. The resulting structure is shown in FIG. 3I and FIG. 3J.

FIGS. 4A-4C illustrate exemplary processes for constructing a thin film transistor operable as the first switch 175 or second switch 178 in accordance with the present invention. In the illustrated embodiment, the memory array plane 150 has been processed as described above in FIGS. 3A-3J, thereby providing first and second contact vias 180a and 180b to the thin film transistor structure.

Initially, an amorphous substrate (e.g., amorphous silicon) is provided, and the amorphous substrate 405 is crystallized, for example, through a solid phase epitaxy process. Next, photoresist 407 is used to mask off non-active areas of a thin film transistor (TFT) to be formed, and a well implant is carried out in the active areas of the thin film transistor to be formed, in FIG. 4A symbolized by means of arrows 409. The well implant is then annealed. The resulting structure is shown in FIG. 4A.

Next, the photoresist 407 is stripped and a gate oxide 412 is deposited/grown over the crystallized substrate 405. A TFT gate stack 414 (composed of, e.g., poly-Si and WSi) is next disposed above the gate oxide layer 412. A hardmask (e.g., $Si_3N_4$) 416 and photoresist layer 418 are patterned over the TFT gate stacks 414. The exposed areas, corresponding to the source/drain areas of the TFT, are etched, pocket implants 430 are formed within the source/drain regions (symbolized by means of further arrows 432), and the photoresist mask 418 is removed. The resultant structure (before removal of mask 418) is shown in FIG. 4B.

Next, the pocket implants 430 are annealed. Next, spacers 434 (e.g., made of silicon oxide) are formed on the sidewalls of the TFT gate stack 414, followed by a self-aligned source/drain implant process including an implant process and an anneal process of the implanted doping atoms. The annealed source/drain regions are forming the first and second ports (i.e., source/drain regions) 175a, 175b and 178a and 178b described above. Subsequently, the cavities above the source/drain regions are filled with ILD material 442 and the top surface of the TFT structure is planarized to the level of upper surface of the hardmask 416. The resulting structure is shown in FIG. 4C.

FIGS. 5A to 5J illustrate exemplary processes by which the third conductive via 180c is formed coupled to the signal line 162a in the signal distribution plane 160. Again, the two regions 324, 326 as shown in FIGS. 3C to 3J are shown in FIGS. 5A to 5J as well. In the illustrated embodiment, the signal distribution plane 160 occupies the top layer (e.g., the first metallization plane, also referred to as M0) of the integrated memory assembly to be formed. Prior to following processing steps, the memory array plane 150 has been formed using the operations shown in FIGS. 3A-3J, and the switching plane 170 has been formed using the operations shown in FIGS. 4A-4C.

FIG. 5A and FIG. 5B illustrate a cross-section view (similar to FIG. 3C to FIG. 3J) of the first switch 175, formed as a thin film transistor (TFT). The gate layer(s) 414 is/are as described previously in FIGS. 4A-4C. Overlying the gate layer 414 is a conductive layer 510, which may be composed of W or WSi, the conductive layer forming the gate region 175c of the first switch 175. The conductive layer 510 is in turn overlaid by a dielectric layer 512, which may be composed of $Si_3N_4$. An ILD layer 513 is disposed above the dielectric layer 512, on top of which a hardmask 514 is formed. Photoresist 516 is applied thereover, except in area 517 where the third conductive via 180c is to be formed, and in the area 518 where a contact line is to be made to the gate region of the switching transistor 175. The exposed areas of the hardmask are etched down until the ILD layer 513. FIG. 5A and FIG. 5B illustrate the resulting structure.

Figure 5C:
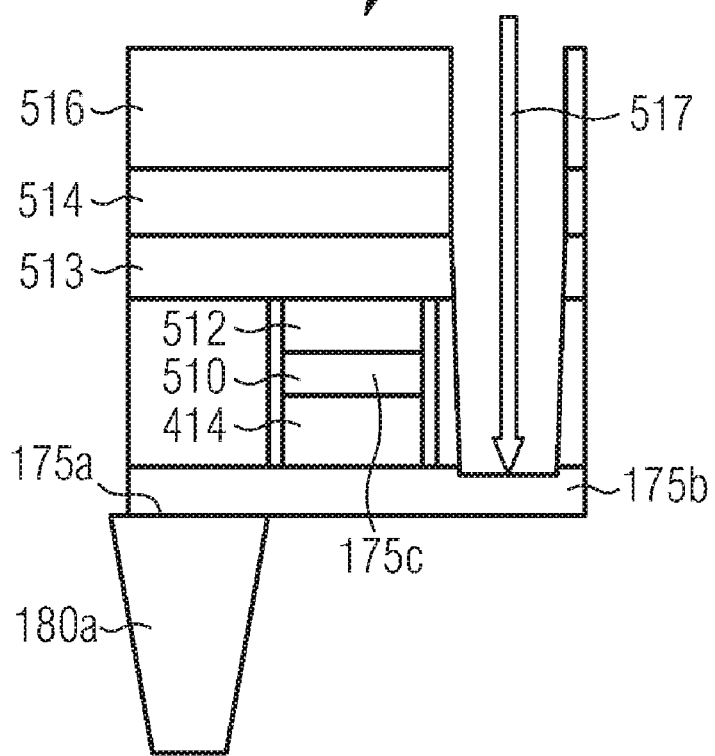
Figure 5D:
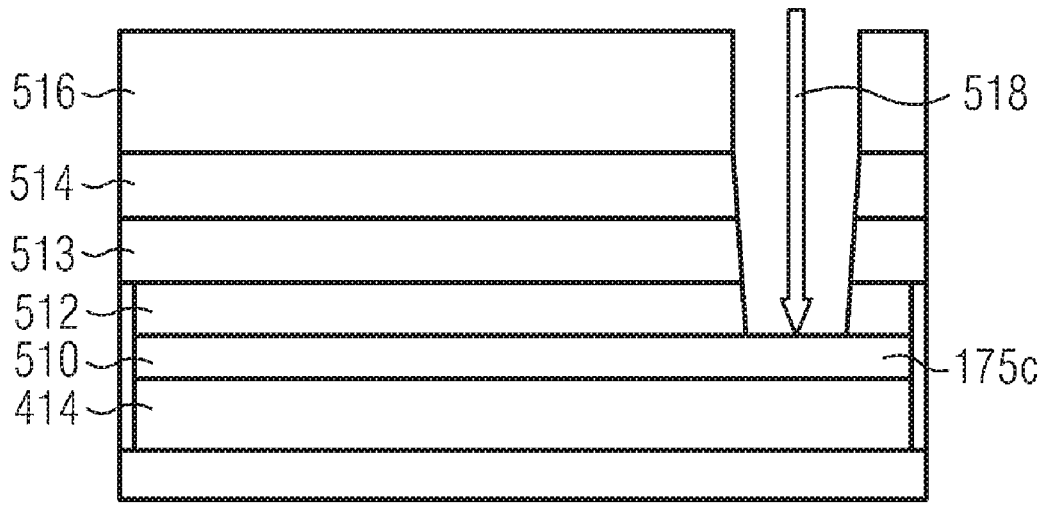

Next, further etching within areas 517 and 518 is provided until the etched channel reaches conductive layer 510 and the implanted region in the source/drain area 175b. The resulting structure is shown in FIG. 5C and FIG. 5D.

Next, the photoresist mask 516 and the hardmask 514 are removed. The exposed conductor layer 510 and the source/drain area 175b are annealed. The exposed areas are cleaned, and conductive via material is deposited within areas 517 and 518 to form the third conductive via 180c and contact to the control terminal 175c, respectively. The top surface is planarized using, e.g., a CMP process using the ILD 513 as a brake. The resulting structure is shown in FIG. 5E and FIG. 5F.

Next, a top/thick metal 542 is deposited in contact with the third conductive via 180c and control line 530, the top/thick metal to be formed into the signal lines 162a and 162c (top/thick metal line for the control terminal 175c of the first transistor 175). The top/thick metal layer 542 may be formed using a reactive ion etching (RIE) process, damascene process, or similar techniques available with the particular fabrication process used. The top/thick metals used may include W, Al, AlCu, Cu, Ag, and similar highly conductive metals available.

Figure 5G:
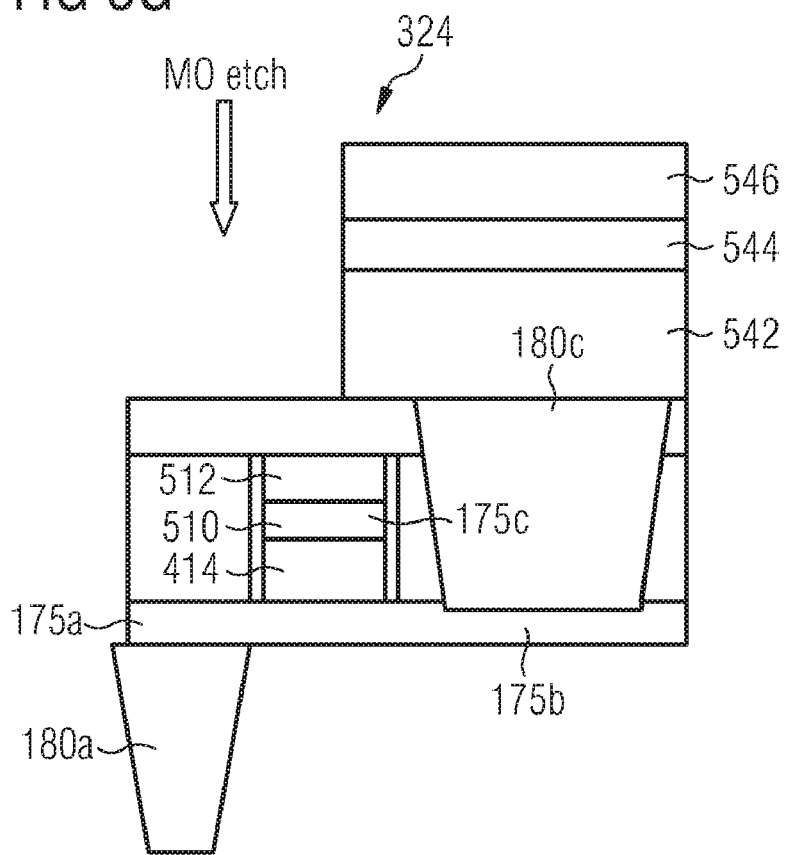
Figure 5H:
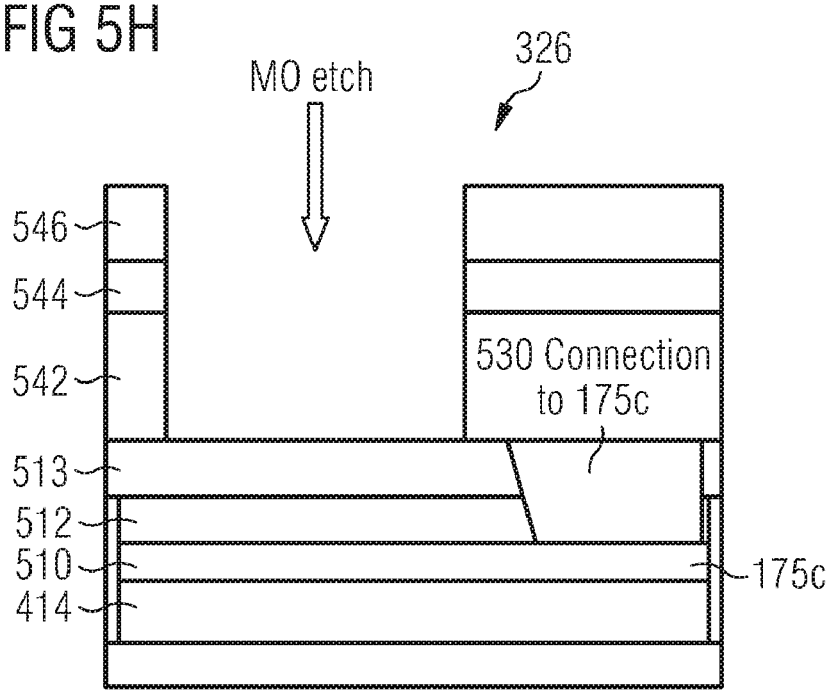

Next, a hardmask 544 is deposited over the top/thick metal layer, and photoresist 546 is deposited in a pattern for forming the signal lines 162a and 162c. The exposed areas are etched down to the ILD layer 513. The resulting structure is shown in FIG. 5G and FIG. 5H.

Figure 5I:
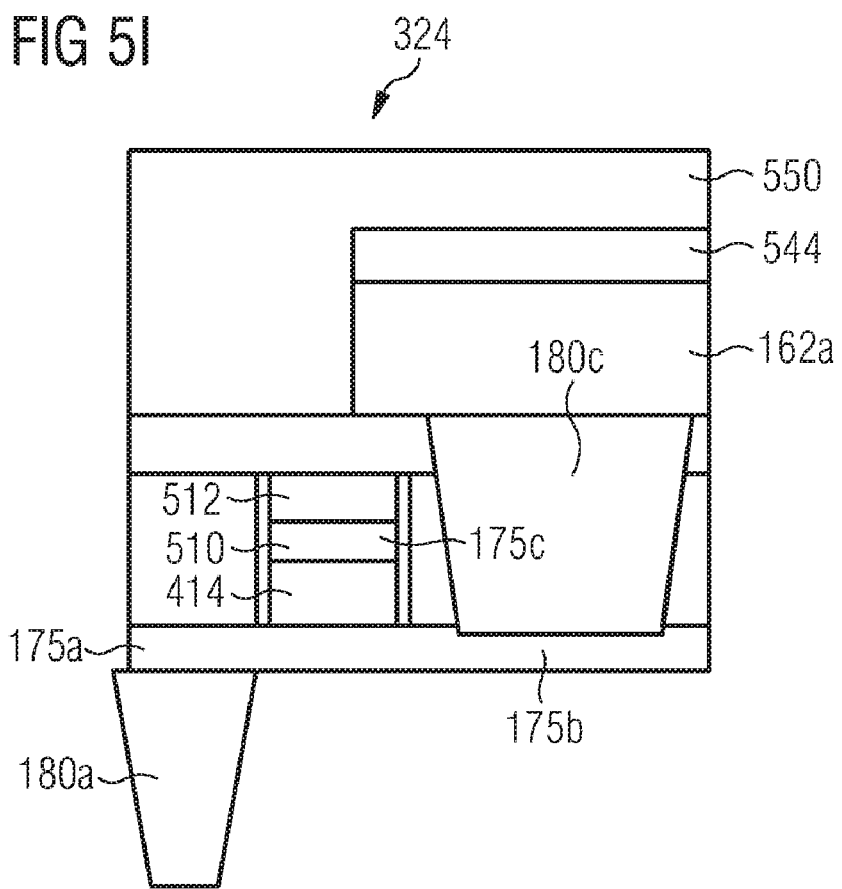
Figure 5J:
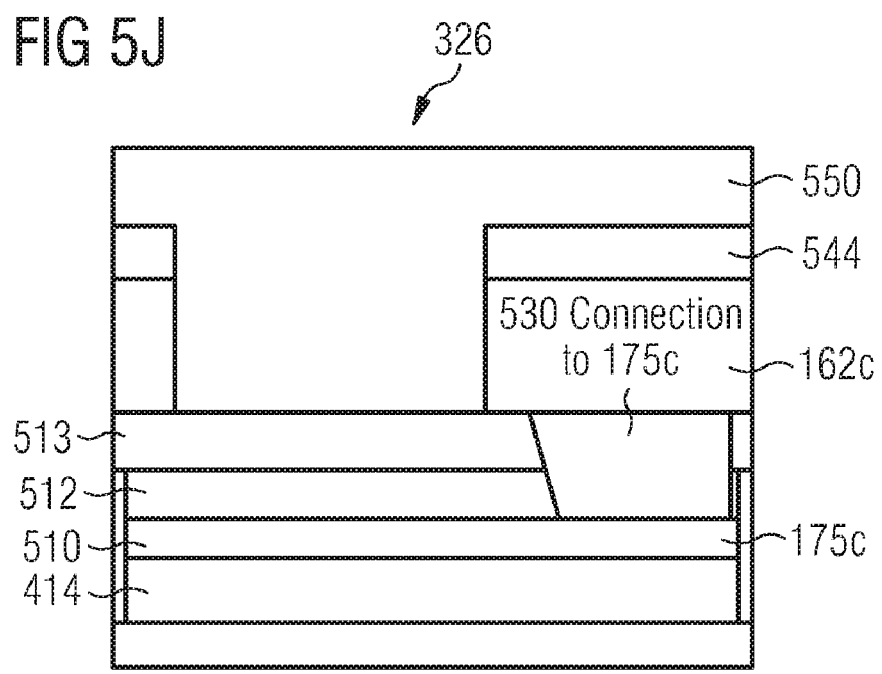

Subsequently, a final ILD layer 550 is applied at least, e.g., over the hardmask 544 to fill the gaps between the top/thick metal signal lines 162a and 162c. The ILD layer 550 is planarized, resulting in the structure as shown in FIG. 5I and FIG. 5J.

FIG. 6 illustrates a perspective view of an exemplary integrated memory array in accordance with the present invention, with previously-identified features retaining their reference numerals. The exemplary embodiment includes a signal plane 160 implemented above a switching plane 170, the switching plane 170 formed above a memory plane 150. The signal plane 160 includes a wide, highly conductive line 162a for providing a highly conductive path in parallel to an active one of three wordlines 156a, 156b, 156c.

Six thin film transistors (TFTs) are shown within the switching plane 170, one TFT 175 including a first conductive via 180a extending to wordline 156a within the memory array plane 150, a second conductive via 180b up to the conductive line 162a in the signal distribution plane 160, and a control port 175c coupled to a control line (not shown) for controlling the conduction state of TFT 175. TFT 178 is coupled along the same wordline 156a at some distance removed, TFT 178 having the same construction as TFT 175. When wordline 156a is active, TFTs 175 and 178 can be switched to an on-state to switch in a highly conductive path in parallel to the wordline 156c between TFT 175 and 178. Of course, a longer portion of the highly conductive line may be switched in by switching on TFTs that are either before 178 and/or after TFT 175. In such an instance, intermediate TFTs (those TFTs that are located between the beginning and ending TFT) may be deactivated/switched off to conserve power, or alternatively, they may be switched on to provide further a decrease in the total effective resistance of the line. The highly conductive line 162a is shown commonly coupled to three wordlines 156a, 156b, and 156c, as only one of these wordlines is active at one time in the illustrated embodiment. Through such an implementation, the highly conductive line 162a can be formed wider than would otherwise be permitted. In other embodiments, the conductive line 162a may be commonly connected to a larger or smaller number of lines, e.g., the conductive line 162a may be coupled to only the wordline 156a. In such an embodiment, the highly conductive line 162a is narrower, but its material composition and height will provide sufficiently low resistivity to provide the desired decrease in the effective wordline resistance when coupled in parallel to the wordline 156a.

FIG. 7 illustrates an exemplary method 700 of manufacturing an integrated circuit in accordance with the present invention.

At 702, a cell array plane is formed including a cell array, the cell array including a plurality of cells, wherein at least one of the cells is coupled to an address line.

At 704, a switching plane is formed coupled to the cell array plane, the switching plane including a first switch having a first port coupled to the address line in the cell array plane, a second port, and a control port.

At 706, a signal distribution plane is formed coupled to the switching plane, the signal distribution plane comprising a signal line coupled to the second port of the switch of the switching plane.

Figure 8A:
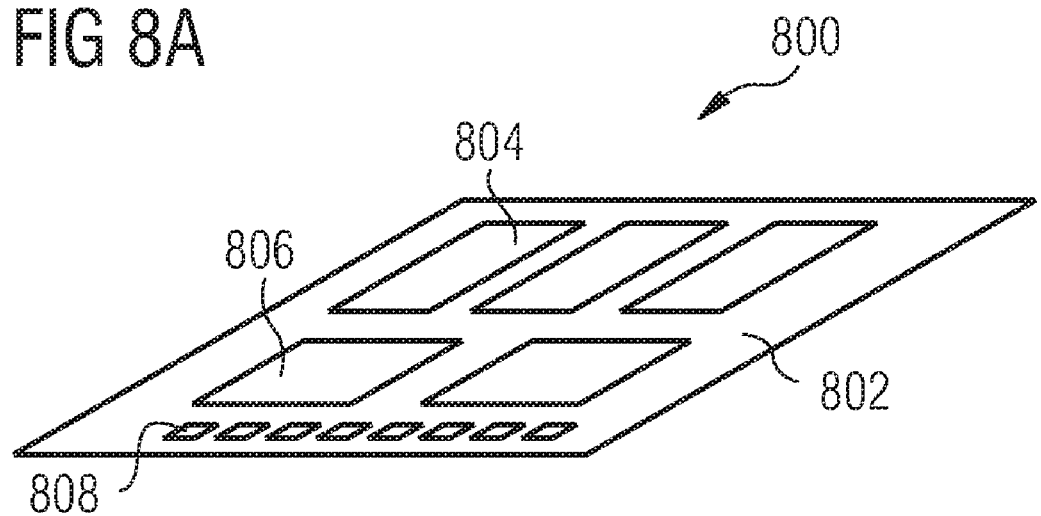
FIGS. 8A and 8B show a memory module (FIG. 8A) and a stackable memory module (FIG. 8B) in accordance with an embodiment of the invention.
Figure 8B:
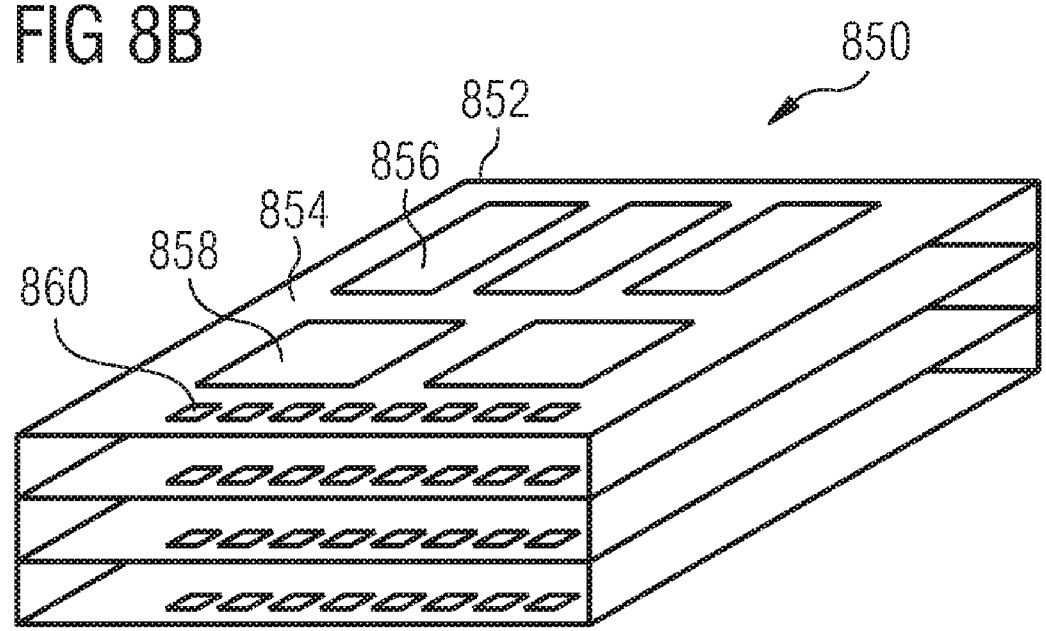

As shown in FIGS. 8A and 8B, in some embodiments, memory devices such as those described herein may be used in modules. In FIG. 8A, a memory module 800 is shown, on which one or more memory devices 804 are arranged on a substrate 802. The memory device 804 may include numerous memory arrays, each of which uses a memory array in accordance with an embodiment of the invention. The memory module 800 may also include one or more electronic devices 806, which may include memory, processing circuitry, control circuitry, addressing circuitry, bus interconnection circuitry, or other circuitry or electronic devices that may be combined on a module with a memory device, such as the memory device 804. Additionally, the memory module 800 includes multiple electrical connections 808, which may be used to connect the memory module 800 to other electronic components, including other modules.

As shown in FIG. 8B, in some embodiments, these modules may be stackable, to form a stack 850. For example, a stackable memory module 852 may contain one or more memory devices 856, arranged on a stackable substrate 854. The memory device 856 contains memory cells that employ memory elements in accordance with an embodiment of the invention. The stackable memory module 852 may also include one or more electronic devices 858, which may include memory, processing circuitry, control circuitry, addressing circuitry, bus interconnection circuitry, or other circuitry or electronic devices that may be combined on a module with a memory device, such as the memory device 856. Electrical connections 860 are used to connect the stackable memory module 852 with other modules in the stack 850, or with other electronic devices. Other modules in the stack 850 may include additional stackable memory modules, similar to the stackable memory module 852 described above, or other types of stackable modules, such as stackable processing modules, control modules, communication modules, or other modules containing electronic components.

As readily appreciated by those skilled in the art, the described processes may be implemented in hardware, software, firmware or a combination of these implementations as appropriate. In addition, some or all of the described processes may be implemented as computer readable instruction code resident on a computer readable medium (removable disk, volatile or non-volatile memory, embedded processors, etc.), the instruction code operable to program a computer of other such programmable device to carry out the intended functions. Further particularly, the termed "coupled" refers to components which are in direct electrical contact, as well as components which are indirectly connected through one or more intervening components. Furthermore, the methods of the present invention are not limited to the particular sequence shown, and the illustrated processes may be performed in one or more alternative sequences in accordance with the present invention.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An integrated circuit, comprising:
   a cell array plane comprising a cell array having a plurality of cells, at least one of the plurality of cells coupled to an address line;
   a signal distribution plane monolithically integrally formed with the cell array plane and comprising a signal line distributing a signal therealong; and
   a switching plane monolithically integrally formed with and coupled between the cell array plane and the signal distribution plane, the switching plane comprising a first switch having a first port coupled to the signal line in the signal distribution plane, a second port coupled to the address line in the cell array plane, and a control port controlling a conduction state of the first switch, the first switch being operable to selectively conduct a signal between the signal line and the address line.

2. The integrated circuit of claim 1, wherein the cells comprise memory cells.

3. The integrated circuit of claim 1, wherein the switching plane further comprises a second switch having a first port coupled to the address line, a second port coupled to the signal line and a control port controlling a conduction state of the second switch,
   wherein the signal line is coupled between the first and second switches, and
   wherein the first and second switches are operable to selectively couple the signal line in parallel with at least a portion of the address line.

4. The integrated circuit of claim 1, wherein the signal distribution plane is disposed above the switching plane, and wherein the switching plane is disposed above the cell array plane.

5. The integrated circuit of claim 1, wherein the first switch comprises a field effect transistor, the field effect transistor comprising:
   a first source/drain region coupled to the signal line;
   a second source/drain region coupled to the address line in the cell array plane; and a gate region being operable to control the conduction state of the field effect transistor to selectively pass a signal applied to the signal line to the address line.

6. The integrated circuit of claim 5, wherein the field effect transistor comprises a thin film field effect transistor.

7. The integrated circuit of claim 2, wherein the cell array comprises a plurality of non-volatile memory cells.

8. The integrated circuit of claim 2, wherein the cell array comprises a plurality of volatile memory cells.

9. An integrated circuit, comprising:
a memory array plane comprising a memory array having a plurality of non-volatile memory cells, at least one of the plurality of non-volatile memory cells coupled to an address line; and
a switching plane monolithically integrally formed with the memory array plane, the switching plane comprising a first switch having a first port coupled to the address line in the memory array plane, a second port coupled to a signal line, and a control port controlling a conduction state of the first switch, the first switch being operable to selectively conduct a signal between the signal line and the address line.

10. The integrated circuit of claim 9, wherein the switching plane further comprises a second switch having a first port coupled to the address line, a second port coupled to the signal line and a control port for controlling a conduction state of the second switch,
wherein the signal line is coupled between the first and second switches, and
wherein the first and second switches are operable to selectively couple the signal line in parallel with at least a portion of the address line.

11. The integrated circuit of claim 9, wherein the first switch comprises a field effect transistor, the field effect transistor comprising:
a first source/drain region coupled to the signal line;
a second source/drain region coupled to the address line in the memory array plane; and
a gate region being operable to control the conduction state of the field effect transistor to selectively pass a signal applied to the signal line to the address line.

12. The integrated circuit of claim 11, wherein the field effect transistor comprises a thin film field effect transistor.

13. A method for manufacturing an integrated circuit, the method comprising:
forming a cell array plane comprising a cell array, the cell array comprising a plurality of cells, wherein at least one of the cells is coupled to an address line;
forming a switching plane coupled to the cell array plane, the switching plane comprising a first switch having a first port coupled to the address line in the cell array plane, a second port, and a control port; and
forming a signal distribution plane coupled to the switching plane, the signal distribution plane comprising a signal line coupled to the second port of the first switch of the switching plane.

14. The method of claim 13, wherein forming the cell array comprises forming a memory array.

15. The method of claim 14, wherein forming the memory array comprises forming a non-volatile memory array.

16. The method of claim 14, wherein forming the memory array comprises forming a volatile memory array.

17. The method of claim 13, wherein forming the switching plane further comprises forming a second switch having a first port coupled to the address line in the cell array plane, a second port coupled to the signal line formed within the signal distribution plane, and a control port, and wherein the first and second switches are operable to selectively couple the signal line in parallel with at least a portion of the address line.

18. The method of claim 13, wherein forming the first switch comprises forming a thin film field effect transistor.

19. The method of claim 13, wherein forming the signal distribution plane comprises forming the signal line as a metal line, the material of the metal line comprising a material selected from the group consisting of W, Al, AlCu, Cu and Ag.

20. A method for manufacturing an integrated circuit, the method comprising:
forming a memory array plane comprising a memory array, the memory array comprising a plurality of non-volatile memory cells, wherein at least one of the non-volatile memory cells is coupled to an address line; and
forming a switching plane coupled to the memory array plane, the switching plane comprising a first switch having a first port coupled to the address line in the memory array plane, a second port coupled to a signal line, and a control port for controlling a conduction state of the first switch.

21. The method of claim 20, wherein forming the memory array plane comprises forming a non-volatile EEPROM Flash memory array.

22. The method of claim 20, wherein forming the switching plane further comprises forming a second switch having a first port coupled to the address line in the memory array plane, a second port coupled to the signal line formed within the signal distribution plane, and a control port, and wherein the first and second switches are operable to selectively couple the signal line in parallel with at least a portion of the address line.

23. The method of claim 20, wherein forming the switching plane comprises forming a thin film field effect transistor.

24. An integrated memory array, comprising:
a memory array plane comprising a memory array having a plurality of memory cells, at least one of the plurality of memory cells coupled to an address line;
a signal distribution plane monolithically integrally formed with the memory array plane and comprising a signal line distributing a signal therealong; and
a switching plane monolithically integrally formed with and coupled between the memory array plane and the signal distribution plane, the switching plane comprising:
a first switch having a first port coupled to the signal line in the signal distribution plane, a second port coupled to the address line in the memory array plane, and a control port controlling a conduction state of the first switch; and
a second switch having a first port coupled to the signal line in the signal distribution plane, a second port coupled to the address line in the memory array plane, and a control port controlling a conduction state of the second switch,
wherein the first and second switches are operable to selectively couple the signal line in parallel with at least a portion of the address line.

25. An integrated memory array, comprising:
a memory array plane comprising a memory array having a plurality of non-volatile memory cells, at least one of the plurality of non-volatile memory cells coupled to an address line; and
a switching plane monolithically integrally formed with the memory array plane, the switching plane comprising:
a first switch having a first port coupled to the address line in the memory array plane, a second port coupled to a signal line, and a control port controlling a conduction state of the first switch, the first switch being operable to selectively conduct a signal between the signal line and the address line; and a second switch having a first port coupled to the address line, a second port coupled to the signal line and a control port controlling a conduction state of the second switch, wherein the first and second switches are operable to selectively couple the signal line in parallel with at least a portion of the address line.

26. A memory module, comprising:

a multiplicity of integrated circuits, wherein at least one integrated circuit of the multiplicity of integrated circuits comprises:

a cell array plane comprising a cell array having a plurality of cells, at least one of the plurality of cells coupled to an address line;

a signal distribution plane monolithically integrally formed with the cell array plane and comprising a signal line distributing a signal therealong; and a switching plane monolithically integrally formed with and coupled between the cell array plane and the signal distribution plane, the switching plane comprising a first switch having a first port coupled to the signal line in the signal distribution plane, a second port coupled to the address line in the cell array plane, and a control port controlling a conduction state of the first switch, the first switch being operable to selectively conduct a signal between the signal line and the address line.

27. The memory module of claim 26, wherein the memory module is a stackable memory module in which at least some of the integrated circuits are stacked one above the other.

28. An integrated circuit, comprising:

a cell array plane means comprising a cell array means having a plurality of cell means, at least one of the plurality of cell means coupled to an address line means;

a signal distribution plane means monolithically integrally formed with the cell array plane means and comprising a signal line means distributing a signal therealong; and a switching plane means integrally monolithically formed with and coupled between the cell array plane means and the signal distribution plane means, the switching plane means comprising a first switch means having a first port means coupled to the signal line means in the signal distribution plane means, a second port means coupled to the address line means in the cell array plane means, and a control port means controlling a conduction state of the first switch means, the first switch means being operable to selectively conduct a signal between the signal line means and the address line means.

* * * * *